(12) United States Patent
Hisatsune et al.

(10) Patent No.: US 6,709,966 B1
(45) Date of Patent: Mar. 23, 2004

(54) SEMICONDUCTOR DEVICE, ITS MANUFACTURING PROCESS, POSITION MATCHING MARK, PATTERN FORMING METHOD AND PATTERN FORMING DEVICE

(75) Inventors: Yoshimi Hisatsune, Kawasaki (JP); Keiichi Sasaki, Yokohama (JP); Hiroshi Ikegami, Hiratsuka (JP); Mie Matsuo, Kamakura (JP); Nobuo Hayasaka, Yokosuka (JP); Katsuya Okumura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 174 days.

(21) Appl. No.: 09/606,152

(22) Filed: Jun. 29, 2000

(30) Foreign Application Priority Data

| Jun. 29, 1999 | (JP) | ............................................ 11-183905 |
| Nov. 24, 1999 | (JP) | ............................................ 11-333373 |
| Jun. 26, 2000 | (JP) | ........................................ 2000-191320 |

(51) Int. Cl.[7] ............................................. H01L 21/44
(52) U.S. Cl. ....................... 438/613; 438/616; 438/118; 438/119; 438/458; 438/464
(58) Field of Search ................................. 438/613, 616, 438/118, 119, 458, 464; 257/753, 737, 783, 785, 786

(56) References Cited

U.S. PATENT DOCUMENTS

| 5,468,681 | A | * | 11/1995 | Pasch ........................ 437/183 |
| 5,643,831 | A | * | 7/1997 | Ochiai et al. ................ 437/183 |
| 5,769,996 | A | | 6/1998 | McArdle et al. |
| 5,872,051 | A | * | 2/1999 | Fallon et al. ................ 438/616 |
| 6,316,289 | B1 | * | 11/2001 | Chung ........................ 438/118 |

FOREIGN PATENT DOCUMENTS

| JP | 362277751 | * | 12/1987 |
| JP | 05031199 | * | 2/1993 |
| JP | 409186162 | * | 7/1997 |
| JP | P2000-90736 | | 3/2000 |

* cited by examiner

*Primary Examiner*—John F. Niebling
*Assistant Examiner*—Lynne A. Gurley
(74) *Attorney, Agent, or Firm*—Finnegan, Henderson, Farabow, Garrett & Dunner, L.L.P.

(57) ABSTRACT

A semiconductor device comprising the bump containing magnetic body, magnetic body, the bump including non-magnetic body for at least partially covering the magnetic body, mixture of magnetic particles and non-magnetic particles and the bump including baked magnetic particles and baked non-magnetic particles.

8 Claims, 17 Drawing Sheets

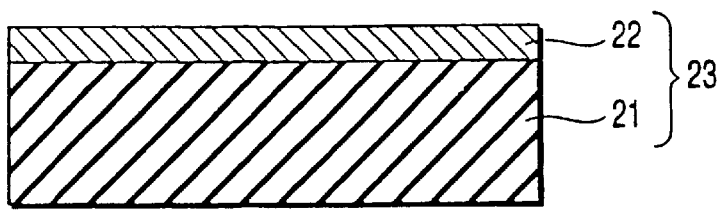
F I G. 2A
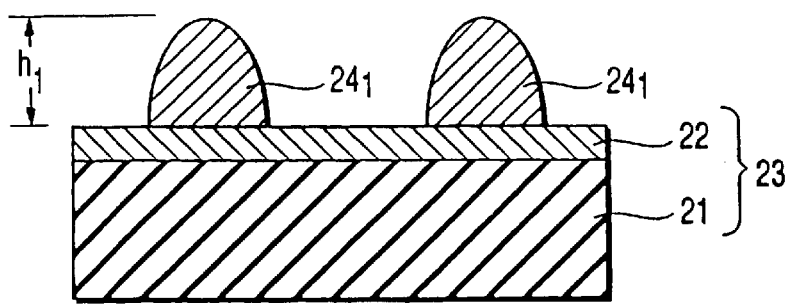
F I G. 2B
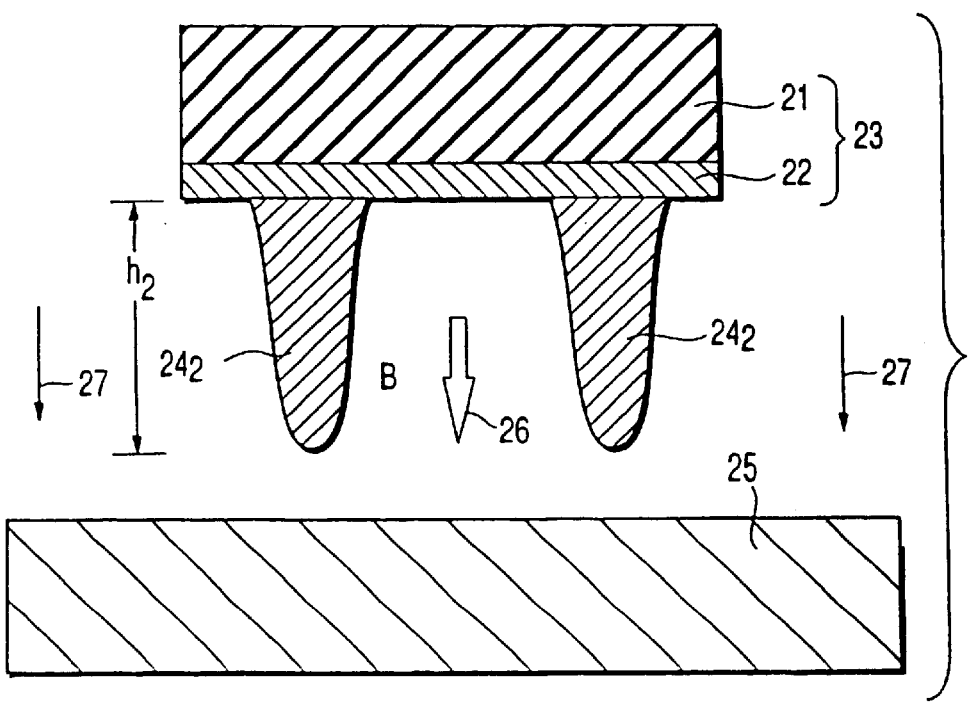
F I G. 2C

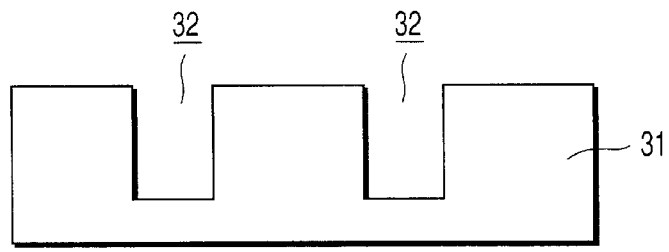
F I G. 3A
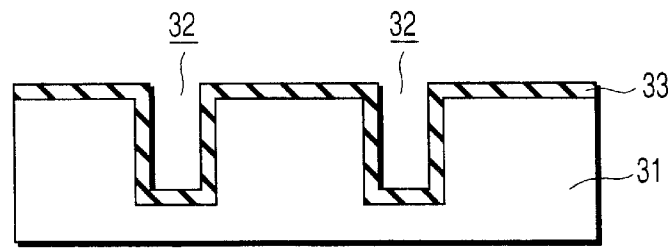
F I G. 3B
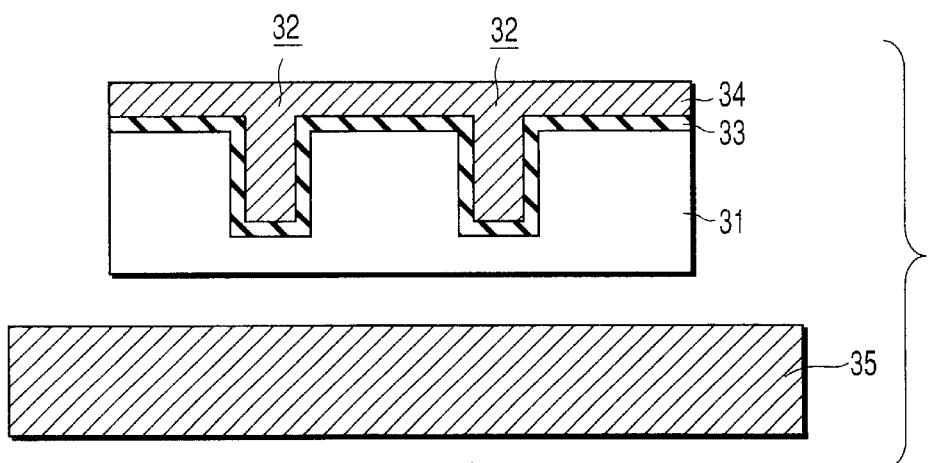
F I G. 3C
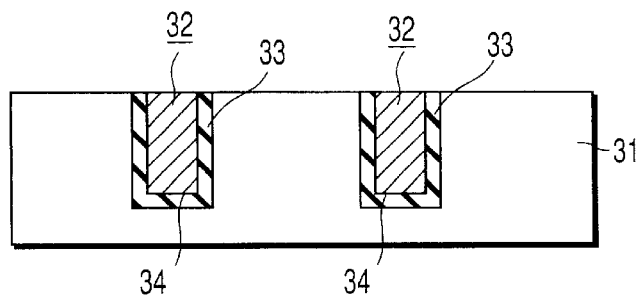
F I G. 3D

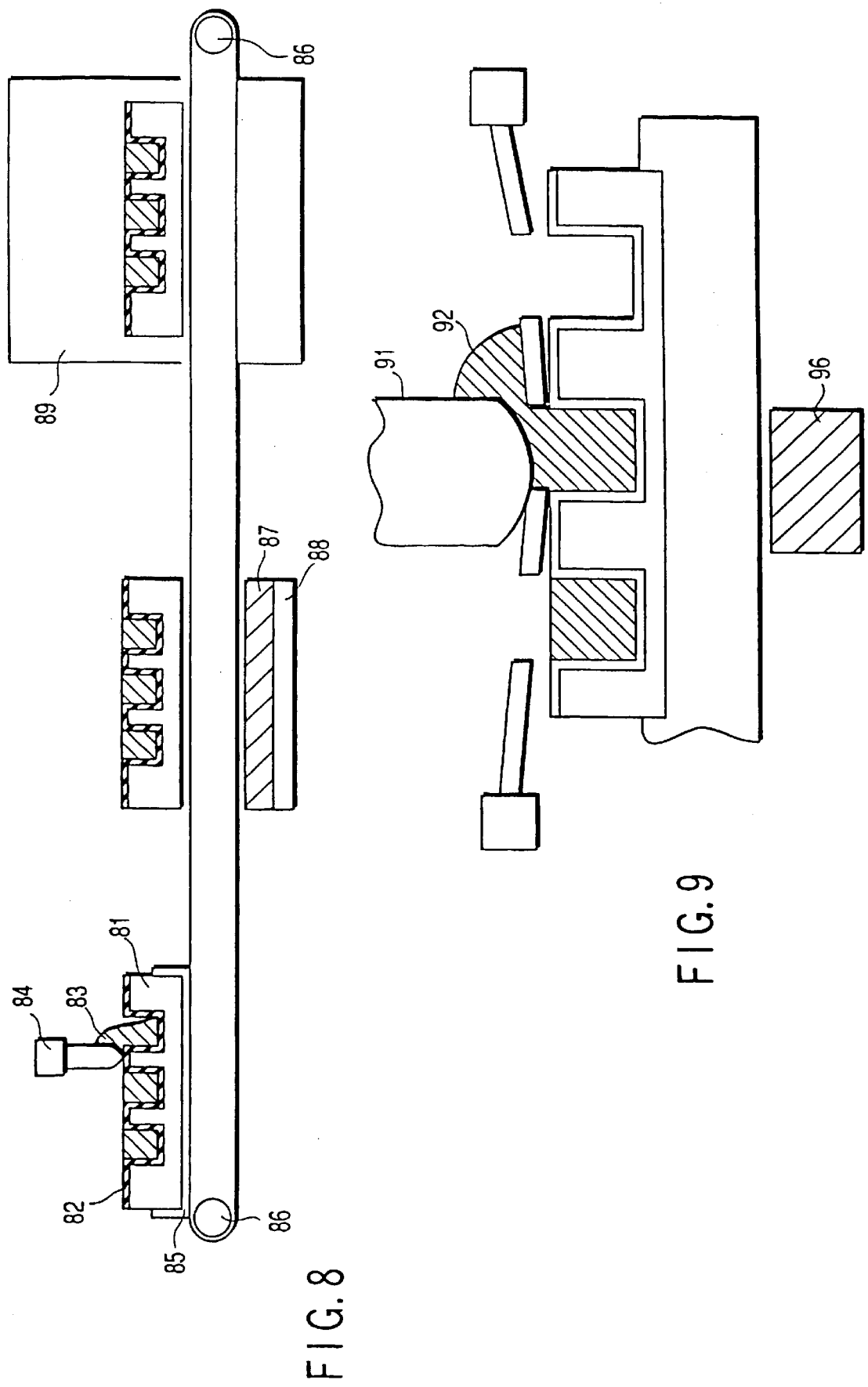

B chip   B sub

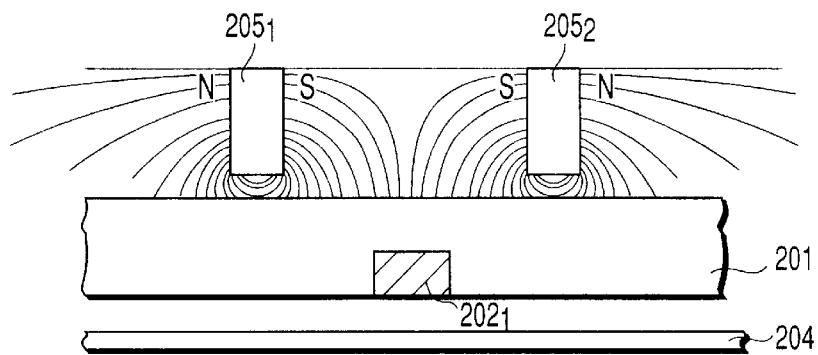
F I G. 34
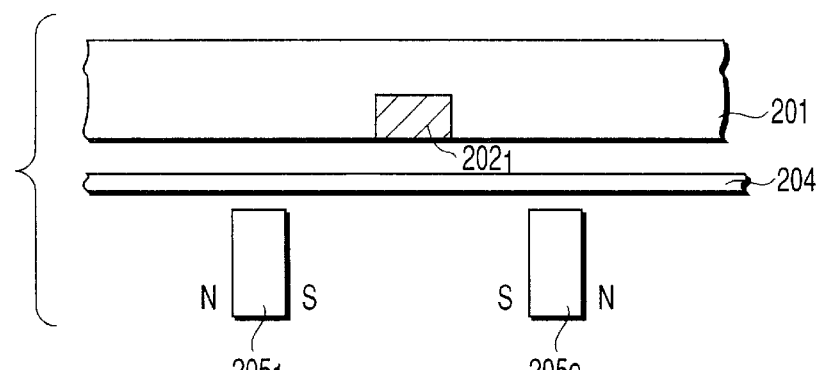
F I G. 35
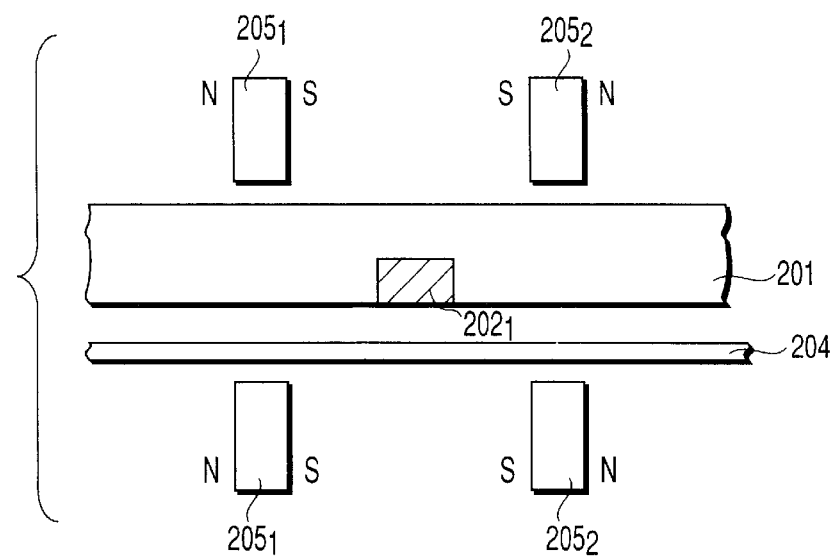
F I G. 36

SEMICONDUCTOR DEVICE, ITS MANUFACTURING PROCESS, POSITION MATCHING MARK, PATTERN FORMING METHOD AND PATTERN FORMING DEVICE

CROSS-REFERENCE TO RELATED APPLICATIONS

This application is based upon and claims the benefit of priority from the prior Japanese Patent Applications No. 11-183905, Jun. 29, 1999; No. 11-333373, Nov. 24, 1999; and No. 2000-191320, Jun. 26, 2000, the entire contents of which are incorporated herein by reference.

BACKGROUND OF THE INVENTION

As the age of the multi-media progresses, research on the narrow-pitch multi-pin package of integrated circuits (ICs) or high-density package bare chips is becoming increasingly active. Under such circumstances, the demand for the high-density printed circuit boards with more levels, such as the high-density multi-layer printed circuit boards with line widths of 50 μm and the land diameter of (via) of 300 μm is becoming commonplace.

The fining method has been proposed in a variety of forms, but the B2 IT (Buried Bump Interconnection Technology) is known as a high-density multi-layer printed circuit board having an environment-friendly characteristic and a good cost performance.

In this method, a circuit substrate, comprising a glass-epoxy substrate and a bump provided thereon through a first circuit layer of copper foil, is provided first; then, an interlayer insulating film is laid on the first circuit layer, and a second circuit layer, including a copper foil is laid on the interlayer insulating film; then, the first circuit layer is connected to the second circuit layer by means of thermal pressure welding method. In this case, the bump protrudes through the interlayer insulating film to be connected to the second circuit layer. The bump is formed by the screen printing method.

Incidentally, the wire bonding method is one of the conventional packaging methods of semiconductors. Recently, however, the packaging method by using the bump is becoming popular because of its being suited for high-density packaging.

Similar to the above packaging method, there are the packaging methods by using TAB, flip chip, etc. As such, how to form the bump is the key technology for these methods.

As bump forming methods, the evaporation method, galvanizing method, and screen printing method have been proposed. However, these forming methods have the problems described below. That is, the forming method by using the evaporation method takes too much time to form the bump, which results in a high manufacturing cost. The forming method by using the galvanizing method has a drawback, in that it requires a complex process comprising the processes for resist application, photolithography, and etching in order to provide the openings corresponding to the size and the pitch of the electrodes and forming the bump by the galvanizing method or electroless plating method.

In contrast, the forming method by using the screen printing method is simpler and more economical in terms of the forming process, since the bump can be formed where a mask having an opening corresponding to the bump is laid on the substrate; a paste is applied on the mask; the mask is printed on the substrate by using a squeegee; then the paste is baked to remove the solvent and resin components from the paste, thereby forming the bump.

However, the forming method by using the screen printing method has a problem as described below.

The height of the bump is dependent on the film thickness. The film thickness of the mask cannot be determined freely in relation with the dimensions of the bump due to the limitation arising from the embedding ability and passability of the paste with respect to the opening of the mask. This gives rise to a problem in that the smaller the size of the bump, the lower the height of the bump. Such a problem can be overcome by repeating the screen printing process several times, but this leads to the increase in the complexity of process and forming cost.

FIG. 26 shows the conventional method of position matching between the substrate and the chip.

In this position matching method, first the position of the pad 302 of the substrate 301 relative to any given point (origin) is determined by a camera 303. Similarly, the positions of the chip 304 the bump 305 relative to another origin are determined by a camera 306.

Next, based on these relative positions and the above 2 origins, the substrate 301, chip 304 or the substrate 301 and chip 304 are shifted to match the position of the pad 302 and the position of the bump 305. Then, the chip 303 is pressed against the substrate 301 to effect the bonding between the substrate 301 and the chip 303.

However, this conventional position matching method has a problem as described below. That is, even if the relative positions of the substrate 301 and the chip 304 are determined accurately, mismatching can occur unless the chip 304 is shifted accurately, since the substrate 301 and the chip 304 are primarily separated from each other. This will become a serious problem in the case of a highly integrated chip.

FIG. 27 shows the position matching method between another conventional substrate and a chip.

In this position matching method, first the position of the pad 302 and the substrate 301 relative to any given point (origin) that is determined by the camera 306. Similarly, the position of the bump 305 of the chip 304 relative to the same origin is determined by the same camera 306.

Then, based on the determined positions of the pad 302 and the bump 305, for example, the position of the bump 305 relative to the pad 302 is determined.

Next, the position of the pad 302 is matched with the position of the bump 305 by shifting the chip 304 by the distance corresponding to the above relative positions.

Subsequently, the chip 304 is lowered and pressed against the substrate 301, thereby effecting the bonding between the substrate 301 and the chip 304.

However, this position matching method has a problem given below. In this position matching method, in determining the positions of the pad 302 and the bump 305, since it is necessary to place the camera 306 between the substrate 301 and the chip 304, the distance between the substrate 301 and the chip 304 increases. Therefore, even if the positions of the pad 302 and the bump 305 are known accurately, mismatching occurs unless the chip 304 is lowered accurately at the time of bonding.

FIG. 28 shows the conventional transfer method of the substrate or the chip.

In this transfer method, a transfer system 311 having a vacuum suction system is used. The substrate or the chip 312 is carried while being held by the transfer system 311 by means of the vacuum suction.

However, this conventional transfer method has a problem given below. That is, the large suction force acting selectively and partially acting on the substrate or the chip 312 causes the deformation or break of the substrate or the chip 312.

BRIEF SUMMARY OF THE INVENTION

An object of the present invention is to provide a semiconductor device having a construction permitting easy formation of a necessary bump having a necessary shape, a pattern forming method permitting the formation of a pattern such as the pattern of the bump and the like and a pattern forming device.

Another object of the present invention is to provide a manufacturing method of a semiconductor device capable of preventing the positional mismatching between two members to be matched with each other at the time of the matching or the positional mismatching of the two members to be matched at the time of the connection thereof after the previous matching and a matching mark to be used therefore.

Another object of the present invention is to provide a semiconductor manufacturing method including a process for enabling a substrate or a chip to be transferred free of damage to such substrate or chip.

The semiconductor device according to the present invention is characterized by being provided with a bump including a magnetic substance. Further, in order to form the bump having such a property, the manufacturing method of the semiconductor device according to the present invention is characterized by comprising at least a process for selectively laying a conductive paste onto the substrate and a process for forming a bump including the conductive paste by letting it rise by an external field including the magnetic field of the conductive paste.

In the case of the bump having the structure described above, a bump having a necessary shape (with sufficient height and satisfactory embeddability) can be formed easily.

Further, the semiconductor device manufacturing method according to the present invention is characterized by comprising a process for placing a second matching member, having a second magnetic substance as a second matching mark, above a first matching member, having a first magnetic substance as a first matching mark, a process for detecting the magnetic field produced by the first and the second magnetic substances, a process for determining the positions of the first and the second magnetic substances based on the magnetic field, a process for effecting the matching of the first matching member and the second matching member and a process for connecting the first matching member and the second matching member.

Further, the semiconductor device manufacturing method according to the present invention is characterized by comprising a process for placing the second matching member, with the magnetic substance as the matching mark, above the first matching member, a process for detecting the magnetic field produced by the magnetic substance, a process for matching the first matching member with the second matching member according to the position of the determined magnetic substance and the previously determined position of the first matching member and a process for connecting the first matching member with the second matching member.

With the semiconductor device manufacturing method as is described above, the matching of the first matching member and the second matching member can be made with the matching members kept very close to each other, so that the mismatching between the first matching member and the second matching member at the time of the positional matching and the positional mismatching when connecting the first matching member with the second matching member can be prevented.

Further, another semiconductor device manufacturing method according to the present invention is characterized by comprising a process for providing a holding member with a magnet, a process for holding the substrate or the chip, having the magnetic substance, by the holding member by the magnetic force and a process for transferring the holding member.

In the case of the semiconductor device manufacturing method as is described in the foregoing, the magnetic field produced between the holding member and the substrate or the chip (member to be transferred) is distributed substantially evenly, thereby preventing a large force from acting partially on the member to be transferred. Thus, according to the present invention, the member to be transferred can be transferred without damaging the member to be transferred.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A–2C are sectional views of the materials to be processed illustrating the bump forming method relating to the second embodiment of the present invention.

FIGS. 3A–3D are sectional views of the materials to be processed illustrating the bump forming method relating to the third embodiment of the present invention.

FIG. 8 is a schematic view illustrating the past embedding system relating to the fifth embodiment of the present invention.

FIG. 9 is a schematic view showing a variation of the system given in FIG. 8.

FIG. 34 shows another improved embodiment of the seventh embodiment.

FIG. 35 shows a variation of the improved embodiment of FIG. 34.

FIG. 36 shows another variation of the improved embodiment of FIG. 34.

DETAILED DESCRIPTION OF THE INVENTION

The embodiments of the present invention will be described below referring to the accompanying drawings.

The First Embodiment

Figure 1A:
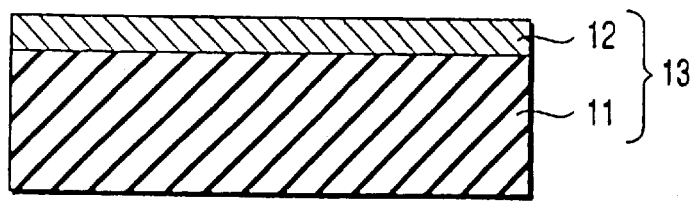
FIGS. 1A–1C are sectional views of the materials to be processed illustrating the bump forming method relating to the first embodiment of the present invention.
Figure 1B:
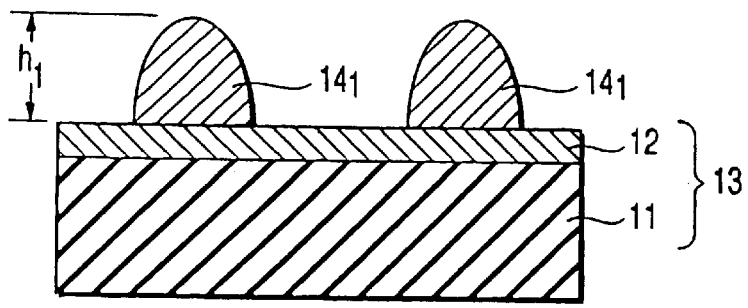
Figure 1C:
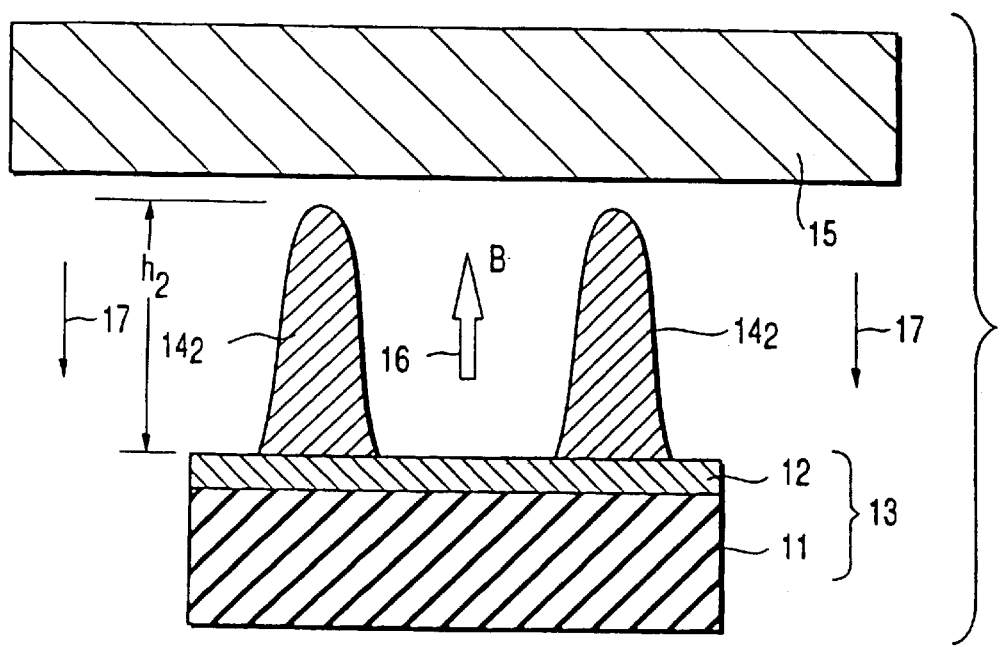

FIGS. 1A–1C are sectional views of materials to be processed illustrating the bump forming method relating to the first embodiment of the present invention. In this connection, the explanation will be made as to the bump forming method as a part of the manufacturing method of the high-density multi-layer printed circuit board employing the B2 IT method.

First, as shown in FIG. 1A, there is provided a circuit substrate 13 comprising a glass-epoxy substrate 11 with a copper-foil circuit layer 12 laid thereon.

Next, as shown in FIG. 1B, a bump 141, with height h1, is formed on the circuit layer 12 by using a conductive paste including Ni particles (magnetic particles), Au particles, resin, solvent and the like and the printing method such as the screen printing method. In this stage, sufficient height of the bump cannot be obtained.

As the magnetic particles, Fe particle, Co particle and the particles of the alloy of Fe and Co may be used besides the Ni particle.

Next, as shown in FIG. 1C, the bump 142, having a cone-like acute point with a gentle gradient and height of h2 (>h1), can be formed by letting the bump 141 (of FIG. 1B) rise by means of a magnetic field B, which is generated by a magnet 15 and substantially perpendicular to a substrate 13, before the solvent component in the bump 141 (of FIG. 1B) is diffused by evaporation. In the figure, 16 denotes the direction of the magnetic field B, and 17 denotes the direction of gravity. The magnet 15, for example, may be a permanent magnet or electromagnet. The electromagnet is preferable for easily obtaining magnetic attraction. Next, the bump 142 is hardened while the magnetic field is effective so that the shape of the bump can be maintained even after the magnetic field has become non-existent. When the hardening type paste is used, the bump can be formed in a method similar to the conventional method after the hardening process, while, when the baking type paste is used, a baking process may be added.

In the case of the method according to the present embodiment, the printing process is required to operate only once by using a conductive paste having magnetism as the conductive paste and by letting the bump 141 (of FIG. 1B) rise to the necessary height by the force of the magnet 15, as shown in FIG. 1C. Thus, the bump having a desired height can be formed with ease and low cost.

Further, according to the present embodiment, the height of the bump 142 can be controlled by the magnitude of the magnetic force (magnetic field) of the magnet 15, and thus it is possible to form the bump 142 having a height of several tens of micrometers and an acute point. That is, the bump having a height and shape sufficient to break through the interlayer insulating film.

Further, the result of the examination indicates that the direction of the magnetization of the bump 142 is uniform.

In contrast, in the case of the bump forming method by using the conventional screen printing method, one operation of the screen printing process by using the conductive paste is not sufficient to break through the interlayer insulating film, thereby requiring the printing process to be repeated several times.

For this reason, it is necessary for the conventional method to repeat several times a series of screen printing processes comprising the conductive paste printing process and temporary baking process, thereby making the process complex. Further, compared with other methods, the conventional method has the problem of the high manufacturing cost despite its relatively high cost performance.

Further, the bump is desired to have a cone-shape acute point and a gentle gradient, but, if the conventional screen printing method is applied, it is impossible to create a large difference in the area between the point and the base of the bump, thereby producing a ladder-like gradient.

Figure 20:
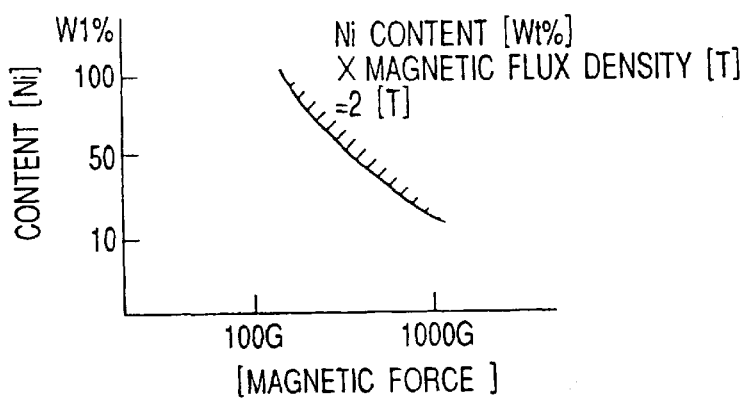
FIG. 20 shows the conditions enabling easy formation of the bump having plug diameter of 100 $\mu$m or less and height of 100 $\mu$m or more according to the result of the study.

Further, the present inventors studied the conditions under which the bump having a plug diameter of 100 $\mu$m or less and a height of 100 $\mu$m or more can be formed easily. For this purpose, the relationship between the content A [wt %] of Ni in the conductive paste and the magnetic flux density B [T], and, as a result, it was found that, where the A and B are within the diagonally hatched range of FIG. 20, that is, within the range of A [wt %]×B [T]>2[wt %·T], the bump having a plug diameter of 100 $\mu$m or less and a height of 100 $\mu$m or more can be formed easily.

Figure 21A:
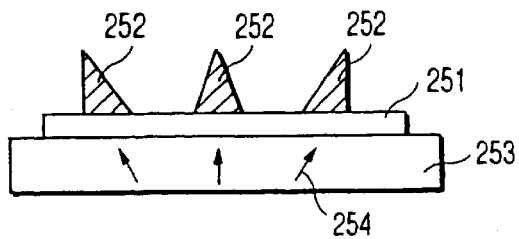
FIGS. 21A–21B show the processes whereby the bumps, having gradients varying depending on the direction of magnetic field, are formed and the directions of the magnetic fields.
Figure 21B:
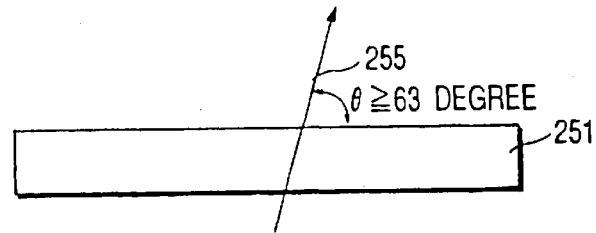

Further, when forming the bump according to the method of the present embodiment, as shown in FIG. 21A, the gradient of the bump 252 varies as the direction of magnetic field 254 varies. Where the gradient of the bump 252 is too large, the bump 252 formed on a substrate 251 is broken, thereby making it impossible to connect two circuit layers (upper and lower layers) at the time of the thermal pressure welding by the B2 IT method. Further, it is not desirable for the apex of the bump 252 to be formed outside the base of the bump 252. In this point of view, the preferable direction of the magnetic field is studied, and, as a result, it was found that the direction θ of the magnetic field to the surface of the substrate 251 is 63° or more as shown in FIG. 21B.

To summarize what is discussed in the foregoing, where the paste containing the Ni is used, and a magnet is arranged to satisfy A [wt %]×B [T]>2[wt %·T] and θ>64°, the optimum bump 142 can be formed easily.

The Second Embodiment

This embodiment differs from the first embodiment in that the bump 241 is formed by positively utilizing the gravity other than the magnetic field.

If the bump 241 is formed in a procedure such that, after forming the bump 241, the magnet 25 is disposed on the bump, and that the bump 241 is made to rise by the force of the magnetic field, the height h2 of the bump 242 is dependent on the balance between the magnetic field and a gravity acting upwardly and reversely along a common vertical to the magnetic field. Therefore, it is necessary to apply a magnetic field having a magnitude, which is increased by the amount corresponding to the gravity, to the bump 241.

For this reason, according to this embodiment, as shown in FIGS. 2A–2C, after forming the bump 241, by turning upside down a circuit substrate 23 to dispose the magnet 25 thereunder, the magnetic field and the gravity can be made to act in the same direction with respect to the bump 241.

By doing so, it becomes possible to control the height of the bump 242 even with the magnet 25 having a relatively small magnetic force.

Further, in the figure, 21 denotes a glass-epoxy substrate; 22, a circuit layer; 23, a circuit substrate; 26, the direction of magnetic field B; 27, the direction of gravity.

The Third Embodiment

The present inventors have jointly filed an application for a patent relating to a bump forming method, wherein the conventional screen printing method is improved by first forming a mold pattern (e.g., holes and grooves) on a Si substrate by the photography and etching, followed by the embedding of a conductive paste into the pattern and the baking (of the pattern), thereby enabling the bump having a necessary height to be formed.

With this method, the pattern of the Si substrate can be re-used after the bump is removed, so that the pattern can be used semi-permanently, thereby contributing largely to the reduction of the bump manufacturing cost.

However, where the width of the aperture of the pattern is 100 $\mu$m or less, or where the aspect ratio of the pattern is high, it is difficult to evenly embedding the conductive paste into the pattern, causing the formation of voids in the pattern.

The present embodiment is concerned with how to form the bump, wiring and the like with which the above problem can be resolved.

First, as shown in FIG. 3A, a pattern 32, corresponding to the pattern of a desired bump, is formed on a surface such as that of a Si substrate by using the photolithography and the RIE method. By using such methods, a pattern with a small width of aperture and a high aspect ratio can be formed, whereby it becomes possible to form a bump suited for high-density packaging. The figure shows only two patterns 32 for the brevity of the drawing.

Next, as shown in FIG. 3B, an anti-reactive film 33 including an anti-reactive material to the conductive paste is formed on the surface.

Then, as shown in FIG. 3C, a conductive paste, comprising the magnetic Ni particles, Au particles, as conductive particles, having a lower resistance than that of the Ni particles, resin, solvent and the like, is deposited all over the surface, and the magnet 35 is brought close to the bottom of the pattern 32 from the underside thereof, whereby the conductive paste is forced to be drawn to the bottom of the pattern 34 by the magnetic force to evenly fill the inside of the pattern 32 with the conductive paste.

In this case, it is desirable to stir the conductive paste 34 by moving the magnet 35 from the left to the right and vice versa. By doing so, the air in the pattern 32 is easily replaced with the conductive paste for not only preventing the occurrence of the voids but also for enabling the inside of the pattern 32 to be evenly filled with the conductive paste 34.

Finally, as shown in FIG. 3D, the excessive portion of the conductive paste 34 on the outside of the pattern 32 (shown in FIG. 3C) is removed, and the conductive paste 34 is baked to complete the bump 34.

Or, the paste may previously undergo a temporary baking process, and the excessive portion of the conductive paste 34 may be removed, for example, by a CMP (Chemical Mechanical Polishing) method.

As discussed in the foregoing, according to the present embodiment, the inside of groove 32 can be filled evenly with the conductive paste 34 by forcing the magnetic conductive paste 34 to be drawn towards the bottom of the groove 32 by magnetic force.

Further, when applying the forming method of the bump 34 of the present embodiment to the forming method of the bump array, a plurality of bumps 34 may be embedded into the Si substrate 31 by adopting the same arrangement and the same pitch as those of a plurality of the pad constituting pad array.

When a plurality of bumps 34, constituting a bump array, are formed in the manner described above, a plurality of the bumps 34 (bump array) can be removed at a time from the Si substrate, with its pattern (the pattern of the bump array) maintained, from the Si substrate 31 by applying an external magnetic field by using the magnet.

Subsequently, after placing the bump array on the pad array, the bump array and the pad array are connected with each other for a time.

In this case, by bonding the bump array for a time by using a bonding tool according to the procedure of the thermal pressure welding method after separating the bump array placed on the bonding pad from the magnet, the time required for the bonding can be reduced.

It is desirable, however, to integrate the magnet 35 with the heating tool and pressure welding tool so that the heating and the pressure welding can be carried out without separating the magnet from the bump array. By doing so, it becomes possible to maintain the original positional accuracy of the pattern 32 formed on the Si substrate.

The Fourth Embodiment

Next, the structure of the bump itself will be described.

Figure 4A:
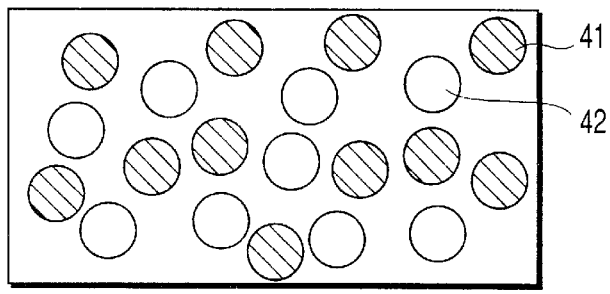
FIGS. 4A–4C are sectional views illustrating the bump and its forming method relating to the fourth embodiment of the present invention.
Figure 4B:
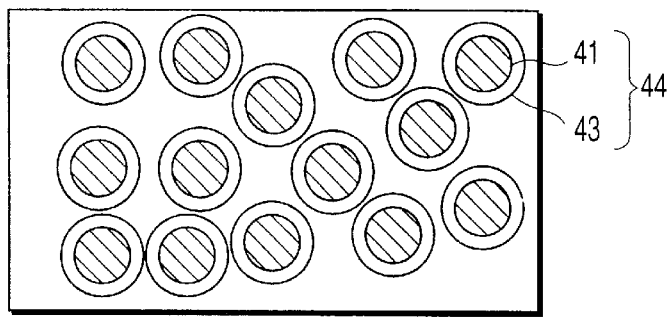

According to the above embodiment, as shown in FIG. 4A, as the magnetic and conductive paste, the paste containing the magnetic particles 41 and conductive particles 42 is used, but, as shown in FIG. 4B, a conductive paste containing a composite particles 44 including the magnetic particles 41 having respective surfaces covered with a conductive film 43 may be used.

Figure 4C:
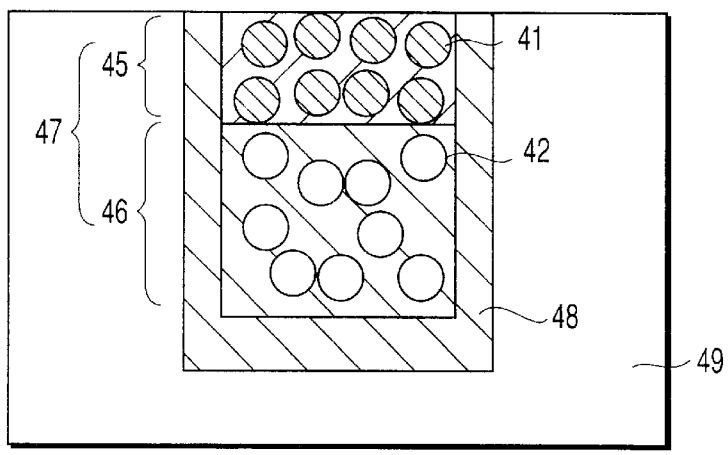

Further, as shown in FIG. 4C, when embedding the conductive paste into the pattern, it is also possible to form a laminate type bump 47 by separately applying two different kinds of conductive pastes, namely, the paste 45 containing magnetic particles 41 and paste 46 containing the conductive particles 42. In the figure, 48 denotes an antireactive film, and 49 denotes the Si substrate respectively.

The conductive film preferably has an electric resistance lower than that of the magnetic particles. In general, the magnetic particles (magnetic substance) have a conductivity, but there is the possibility that the conductivity declines due to oxidation occurring during the baking process for bump formation. However, it becomes possible to maintain a conductivity for the obtained bump by covering the surfaces of the magnetic particles with a conductive film primarily having a low resistance or capable of maintaining a low resistance, regardless of being oxidized.

Figure 5:
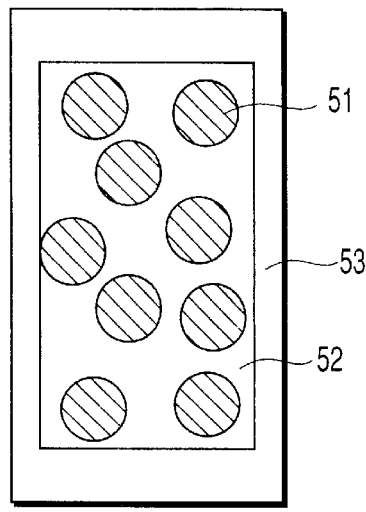
FIG. 5 is a cross-sectional view illustrating the a variation of the fourth embodiment.

Further, as shown in FIG. 5, the whole of the bump-form paste containing a number of magnetic particles 51 may be covered a conductive film 53 instead of covering the individual magnetic particles.

Further, as discussed in the case of the above embodiment, when the conductive film cannot be formed thickly over the surfaces of the magnetic particles, it is effective to use the paste containing the magnetic particles and conductive particles.

Further, in the case of the above embodiment, the conductive paste containing a magnetic substance and the conductive particles having a resistance lower than that of the magnetic substance is used, but a magnetic paste not containing the conductive particles may be used, if the necessary conductivity can be obtained only with the magnetic substance.

The Fifth Embodiment

Figure 6:
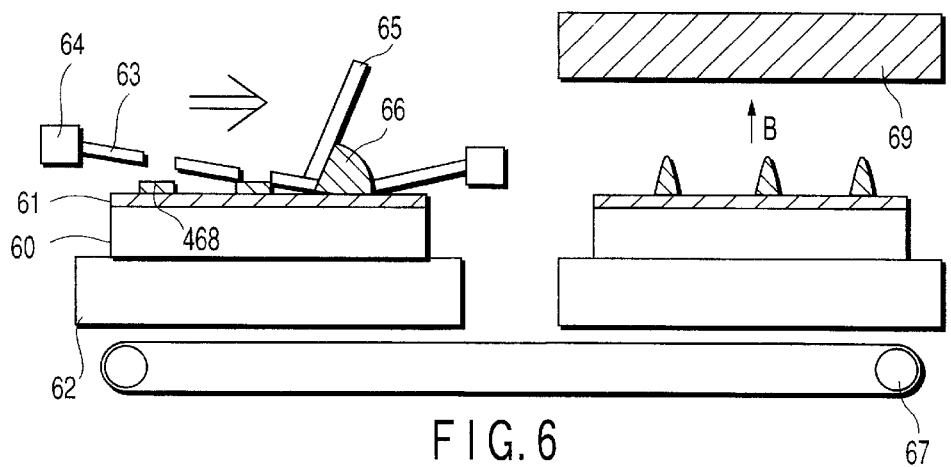
FIG. 6 is a schematic view illustrating the bump forming device relating to the fifth embodiment of the present invention.

FIG. 6 is a schematic view showing a system for forming the bump on the wafer (bump forming device) relating to the fifth embodiment of the present invention.

In this figure, 60 represents a glass-epoxy substrate; 61, a copper foil applied on the glass-epoxy substrate; a printed circuit board comprises the glass-epoxy substrate 60 and the copper foil 61; 62 represents a stage for holding the printed circuit board. Further, 63 represents a plate for printing with a desired printing pattern, this printing plate being placed with a holding frame 64. 65 represents a squeegee for keeping the printing paste thereon so that the printing is permitted to proceed while it moves in the direction of an arrow.

The stage 62 for holding the printed circuit board is placed on a transfer conveyor 67; when the printing of the paste is completed, the printed circuit board is moved to the position where a magnet 69 is disposed before the printed paste 68 dries to have the paste baked in the magnetic field.

Further, in this figure, the magnet is provided on the upper surface of the wafer in order to form the bump by making the paste rise upward, but the same result can be obtained even when the magnet is provided on the back of the wafer.

Figure 7A:
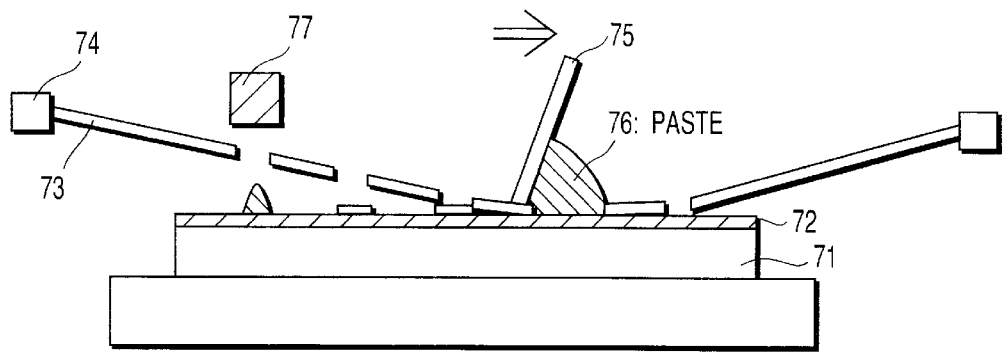
FIGS. 7A–7B are schematic views illustrating the variation given in FIG. 6.

FIG. 7A is a schematic view showing a variation of the system.

Similar to FIG. 6, 71 represents a printed circuit board; 72, a copper foil applied onto the glass-epoxy substrate; 76, printing paste; and 77, a magnet. The squeegee 75 and the magnet 77 move keeping the interval of several mm to several tens of mm.

This system has an advantage that the paste 76 can be prevented from starting to become hard as the solvent evaporates before a printed circuit board 71 containing fine bumps, especially in the case of a large-size board, comes to be held in the magnetic field after completing the printing process.

Figure 7B:
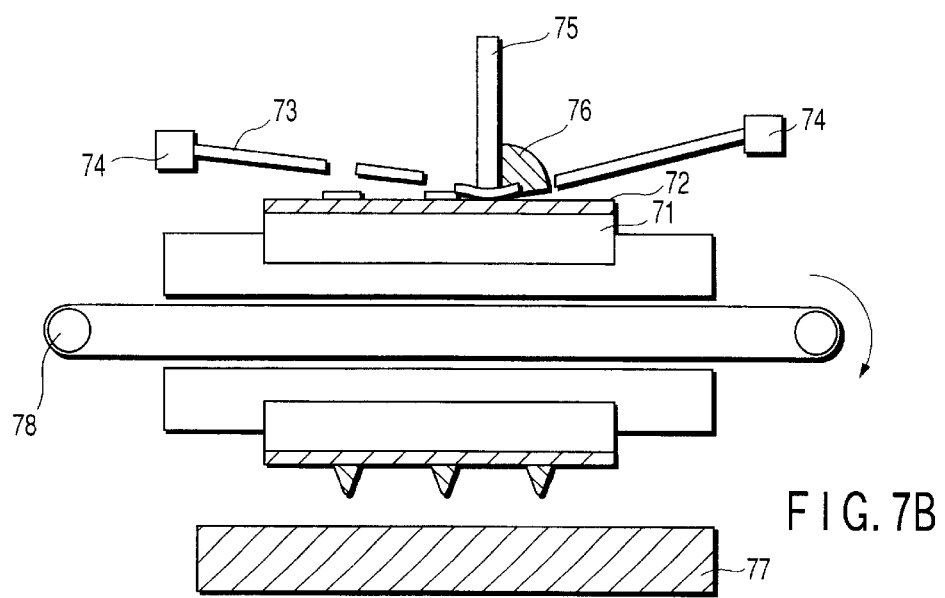

FIG. 7B shows another variation of the present embodiment. This variation is designed so that, after completing the printing process, the surface of the board 71, whereon the paste 76 is printed, can be made to face vertically downward during the process for transferring the board 71 into the magnetic field. In this case, as explained in connection with the second embodiment, since the gravity acts in the direction in which the paste is to be made to rise, it is possible to control the height of the bump to a desired height even with a magnet 77 having a relatively weak magnetic force. Further, in this case, it is possible to improve the removability of the paste 76 from the printing plate 73 by controlling the intensity of the magnetic field and applying the magnetic field from the underside of the printed circuit board 71.

FIG. 8 is a schematic view showing a system (paste embedding system) for embedding the paste into the holes or grooves formed in the surface of the wafer.

81 represents the Si substrate; 82, a (silicon) nitride film ($Si_3N_4$ film); 83, the paste; and 84, a squeegee.

The wafer is placed on a conveyer 86 by being held on a holder 85. First, the paste 83 is embedded into the holes or grooves 87 by using the squeegee 84. In this case, the squeegee may be applied directly to the wafer for embedding the paste, but this method may be replaced with the method by using the plate with the pattern corresponding to the holes or grooves formed thereon. Upon completion of this embedding process, the wafer is transferred by a conveyor 86 to the position where a magnet 87 is provided.

In this stage, the paste is made to be deposited more evenly in the grooves or pattern by the force of the magnet, but the magnet is provided with a mechanism 88 for vibrating it from the left to the right and vice versa. With this action, the air bubbles remaining in the holes or grooves are more quickly replaced with the paste. As a vibration mechanism, the piezoelectric element may be used, for example.

When the paste is deposited evenly, the wafer is transferred into a baking furnace 89 by a wafer conveyor 86 for baking it into bumps. A mechanism for CMP process may be provided to polish the surface of the wafer if there is the possibility that excessive paste remains on the wafer.

FIG. 9 shows a variation of the system shown in FIG. 8. That is, in this variation, a magnet 96, which is movable in the same direction as that of the squeegee 91, is provided under the wafer so that the paste 92 can be drawn into the holes or grooves by magnetic force simultaneously with the progress of the printing process. This method is useful for the printing by using a paste 92 containing a highly volatile solvent or for the printing to cover a large area, since printing and embedding can be carried out simultaneously.

Further, for example, in the case of the system shown in FIG. 8, air bubbles, if they remain, can cause the unevenness of the bump height, but, in the case of this variation, the printing and embedding can be carried out simultaneously, so that the amounts of the paste deposited into the holes or grooves of equal size can better be equalized to form the bumps having better equalized heights.

The Sixth Embodiment

Figure 10:
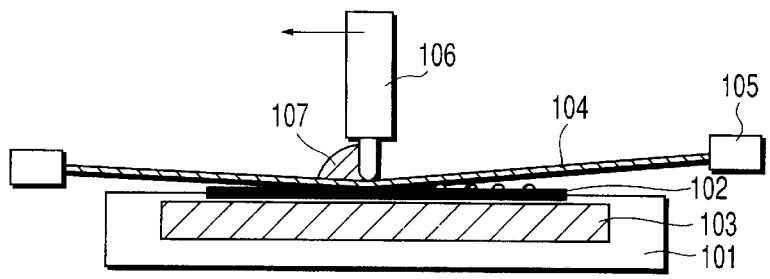
FIG. 10 is a schematic view showing the pattern forming device relating to the sixth embodiment of the present invention.

FIG. 10 is a schematic view showing a pattern forming device relating to the sixth embodiment of the present invention.

In this figure, 101 represents a stage for holding wafer 102, and the stage 101 has an embedded magnet 103. This magnet 103 applies a magnetic field almost vertically to the surface of the wafer 102. Further, 104 denotes a plate for printing (printing plate) with desired printing pattern, and this printing plate 104 is extended with tension within a holding frame 105. Further, the printing plate 104 is held keeping a distance of about 1 mm to the wafer before the printing process starts. Further, 106 denotes a squeegee, which is used for carrying out the printing process with the paste 107 for printing placed on the printing plate 104.

Figure 11:
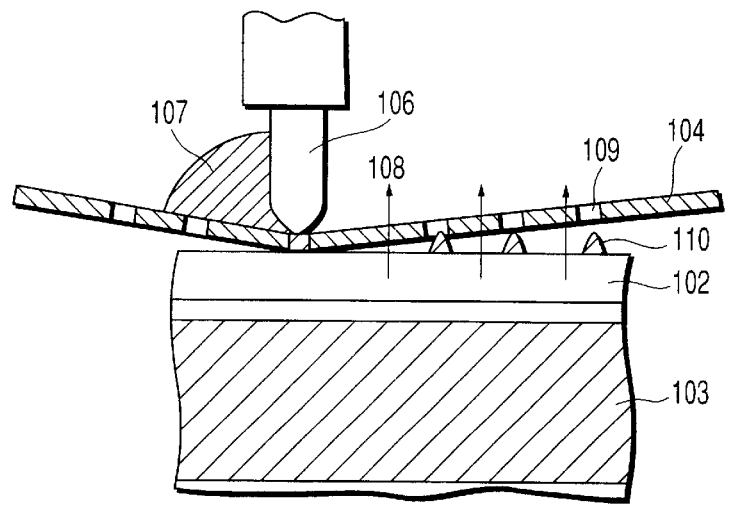
FIG. 11 is an enlarged view of the printing process of the pattern forming device given in FIG. 10.

Next, the process for forming the bump pattern on the wafer 102 by using the present system will be described referring to FIG. 11. FIG. 11 is an enlarged view of the printing section of FIG. 10.

In this embodiment, paste 107 used for printing comprises the Ni particles (average particle size: 0.7 $\mu$m, 60% (vol. %)) dispersed in an organic resin. Further, magnet 103 is a permanent magnet, which produces magnetic force 108 with magnetic flux density of about 5000 gauss in the direction perpendicular to the surface of the wafer.

Before the printing process starts, the wafer 102 and the printing plate 104 are kept apart by about 1 mm from each other, but, when the printing process starts, the printing plate 104 is pressed against the wafer by the squeegee 106, whereby the paste 107 is forced into the holes 109 provided at desired positions in the printing plate 104 to be further transferred onto the wafer 102.

It is confirmed that, when the magnetic field is absent, the volume of the paste that is transferred onto the wafer 102 to the volume of the holes 109 is usually 50% or less, but, when the magnetic field is applied for printing, the volume of the paste that can be transferred for printing to the volume of the holes 109 on the printing plate 104 is 80% or more, thereby proving that the transfer rate of the paste (the rate of transfer onto the wafer) can be improved. Further, the transferred paste presents a convex form due to the effect of the magnetic field, so that the optimum form of the transferred paste for B2 IT process can be obtained only by one application of the paste.

A pre-baking process (a temporary drying process) can be carried out simultaneously with the above-described printing process. That is, the pre-baking can be effected on the magnet 103. In this case, the paste 107 can be hardened without having its initial shape (the shape perpendicular to the wafer surface) changed due to the effect of the magnetic force of the magnet 103. Further, the limitation resulting from the viscosity and thixotropy of the paste 107 can be reduced. The pre-baking process is, for example, carried out at temperatures of 70° C.–100° C. for 1 hour. Subsequently, a final baking process is carried out on the magnet 103. Final baking is carried out, for example, at temperatures of 180° C. for 20–30 minutes.

Figure 29A:
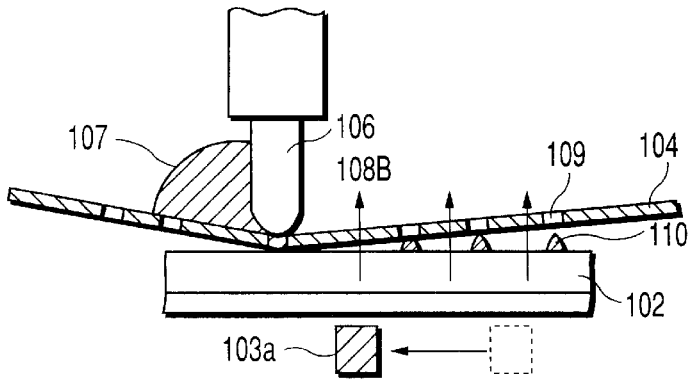
FIGS. 29A–29B show the variations of the sixth embodiment.
Figure 29B:
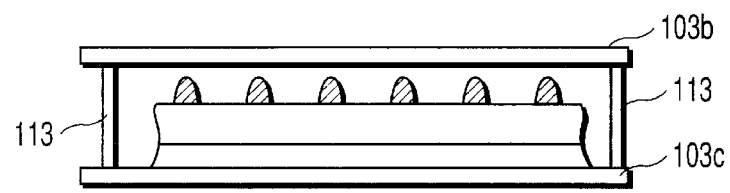

FIGS. 29A–29B show the variations of the present embodiment.

In these variations, the paste is printed by using a scanning type magnet 103a having a magnetic flux 108b as shown in FIG. 29A.

Next, as shown in FIG. 29B, the height of the paste (bump) is adjusted by means of magnets 103b and 103c opposing each other. One of the opposing magnets 103b and 103a is an n-pole magnet, and the other is a s-pole magnet. Further, in the figure, 113 denotes a yoke for suppressing the dispersion of the magnetic field produced by the opposing magnets 103b and 103a.

Subsequently, the pre-baking process (at 70–100° C. for 1 hour) and the final baking process (at 180° C. for 20–30 min.) are carried out.

In these instances of transformation, the height of the paste (the bump) is adjusted, so that the shape of the paste need not be considered in the process shown in FIG. 29A. Further, for the magnets 103a through 103c to be used in the processes shown in FIGS. 29A and 29B, those having larger magnetic forces and being more compact (and lighter in weight) than that of the magnet 103 can be used. If the effect of the yoke 113 is taken into account, the total weight of the magnets 103a through 103c can be reduced to a half of that of the magnet 103, thereby contributing to the reduction of manufacturing cost.

Figure 30A:
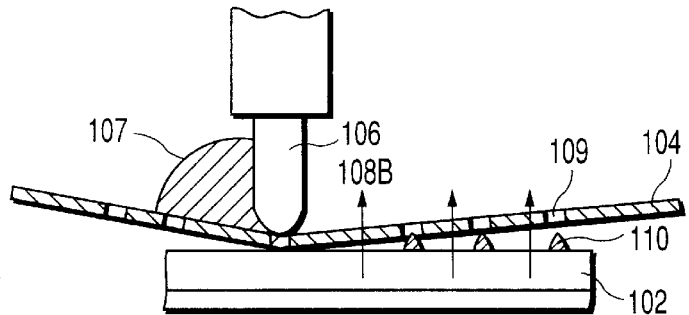
FIGS. 30A–30B show other variations of the sixth embodiment.
Figure 30B:
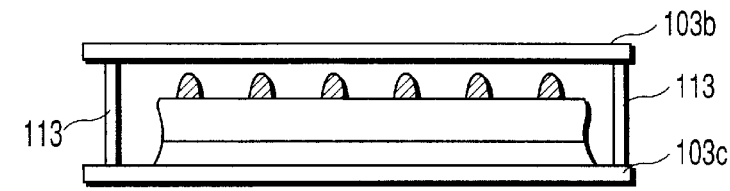

FIGS. 30A–30B show other variations of the present embodiment. The reference numbers in FIGS. 30A–30B are the same as those in FIGS. 29A–29B.

Depending on the kind of the paste 107, the paste can be printed without using the magnet as shown in FIG. 30A.

Next, as shown in FIG. 30B, the height of the paste (bump) 10 is adjusted by using the opposing magnets 103b and 103c. One of the opposing magnets 103b and 103c is an n-pole magnet, while the other is a s-pole magnet. Subsequently, the processes for the pre-baking and final baking (at 180° C. for 20–30 min.) will be carried out. Even in this case, the total weight of the magnets 103a through 103c can be reduced to a half that of the magnet 103 to contribute to the reduction of the manufacturing cost.

Figure 12:
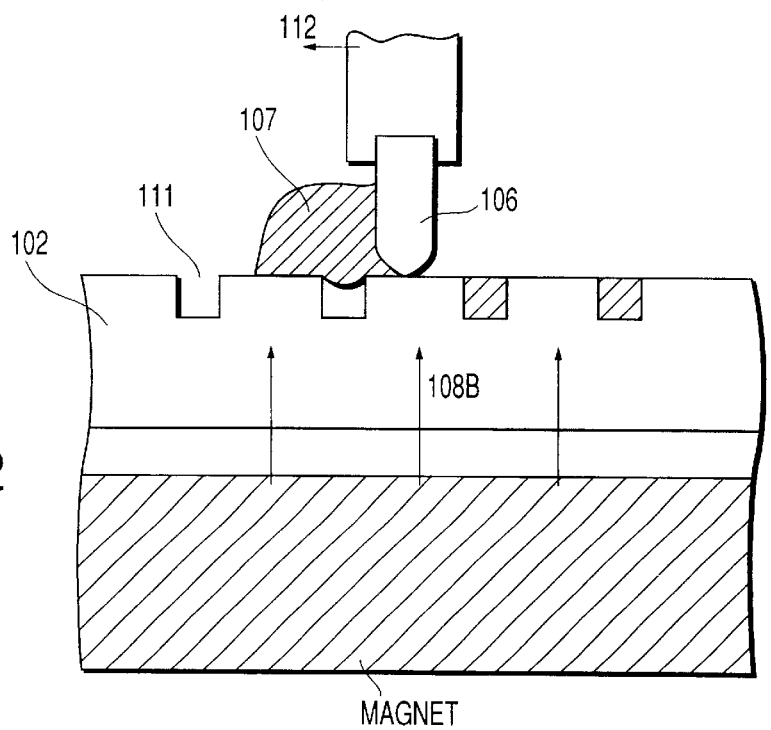
FIG. 12 is an enlarged view of the surface portion of the wafer undergoing the printing operation.

Next, how to fill the holes and grooves formed in the surface of the wafer by using the system shown in FIG. 10 will be described referring to FIG. 12. FIG. 12 is a schematic enlarged view of the surface of the wafer during the printing process in progress. In this case, the printing plate shown in FIG. 10 is not used; the paste 107 is placed directly on the wafer 102, and the squeegee is made to move in the direction of an arrow 112 by directly sliding on the surface of the wafer 102 to fill the grooves (holes) 111 formed on the wafer 102 with the paste. In this case, the intensity of the magnetic field is equal to that in the case shown in FIG. 11. Further, in this case, the Ni paste, similar to that described above, is used.

If the magnetic field is absent, it is hard to fill the grooves (holes) completely with the paste 107, thereby leaving the voids in the embedded paste. On the other hand, when the magnetic field is applied, the paste could be embedded completely into the grooves (holes) 111.

In this embodiment, a permanent magnet is used as the magnet, but an electromagnet may also be used. When the electromagnet is used, not only the magnetic field can be applied, even during the progress of the printing process, but also the timing for applying the magnetic field can be selected freely.

Further, in the case of the system arranged as described above, it is important to use a non-magnetic material for the printing plate, since satisfactory print cannot be obtained if magnetic printing plate is used. Furthermore, it is preferable to use non-magnetic materials for the stage (other than that for the magnet) and its peripheral members so as not disturb the distribution of the magnetic field.

Further, the viscosity of the paste may be reduced by heating or irradiating the paste with an ultrasonic wave in order to improve the adaptability of the paste for embedding and the responsiveness of the paste to the magnetic force. Another method for reducing the viscosity of the paste is the method in which the electric field or magnetic field is applied in terms of the time or in terms of the space.

The Seventh Embodiment

FIGS. 13A–13F are the cross-sectional views of the pattern forming processes relating to the seventh embodiment of the present invention. In this embodiment, as a pattern forming method, the method for forming a plurality of bumps will be described, but this method is also applicable to the formation of other patterns, such as the patterns for a plurality of plugs or wirings. For the formation of the wiring pattern, a brief explanation will be given in the last part of this embodiment.

Figure 13A:
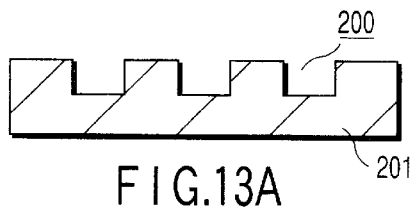
FIGS. 13A–13F are sectional views of the materials to be processed illustrating the pattern formation relating to the seventh embodiment of the present invention.

First, as shown in FIG. 13A, a metal substrate with a groove 200 formed on the surface thereof is provided. The depth of the groove 200 is 5–200 $\mu$m, while the width of the groove 200 is 20–200 $\mu$m. The pattern of the grooves 200 corresponds to the pattern of the bumps.

The thickness of the metal substrate is 500 $\mu$m. The metal substrate having such grooves 200 can easily be formed by employing the galvanizing method. The material of the substrate 201 is, for example, Al. A substrate made from a non-metallic material may be used instead of the metal substrate 201.

Figure 13B:
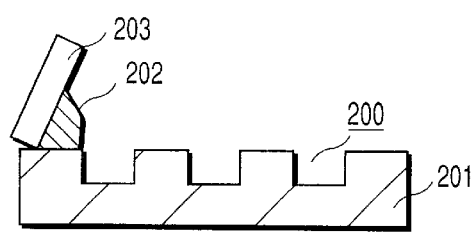
Figure 13C:
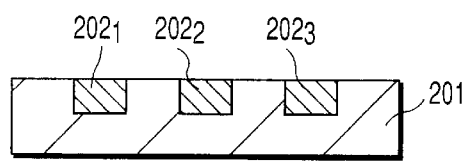

Next, as shown in FIGS. 13B and 13C, the conductive paste 202 containing a ferromagnetic or magnetic substance, which can be attached by the magnet, is applied onto the metal substrate 201, and the squeegee 203 is moved from the left to the right and vice versa until the paste 202 is completely embedded into the grooves 200; the paste remaining outside the groove 200 is removed. As a result, the bumps 2021–2023 including the paste are formed. Since the paste 202 is not baked yet at this stage, the bumps 2021–2023 cannot be regarded as the ordinary bumps, but they are called bumps here for convenience. (The same applies to cases of the later embodiments including the seventh embodiment.) Further, the excess paste 202 can be removed by using the squeegee, but a piece of cloth may also be used in combination with the squeegee.

In order to form strictly defined bumps 2021–2023, it is effective to draw the paste 202 into the grooves 200 by providing a magnet under the metal substrate 201 when embedding the paste 202 into the grooves 200. In this case, it is desirable to provide each of the grooves 200 with a (net) taper so that the characteristic of the paste 202, when embedded into the grooves 200, and the rise of the paste 202 coincide with the center of each groove 200.

Further, the actual number of the bumps is greater than three, though only three bumps 2021–2023 are shown in the figure.

Figure 13D:
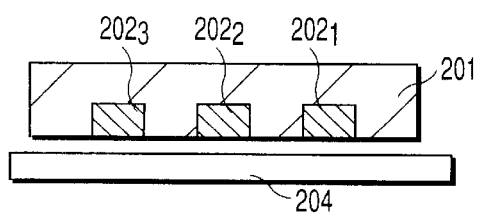

Next, as shown in FIG. 13D, the metal substrate 201, with its surface having the bumps (2021–2023) embedded thereinto, facing downside, is placed horizontally above the substrate (or printing plate) 204 to receive the print. The interval between the metal substrate 201 and the printing plate 204 to receive the print is about 50–100 $\mu$m.

In this case, the metal substrate 201 and the substrate 204 subject to printing are disposed opposing to each other, but the metal substrate 201 and the substrate 204 subject to printing may be disposed in contact with each other. Further, the substrate 204 subject to printing is preferable not to be made of ferromagnetic material.

Figure 13E:
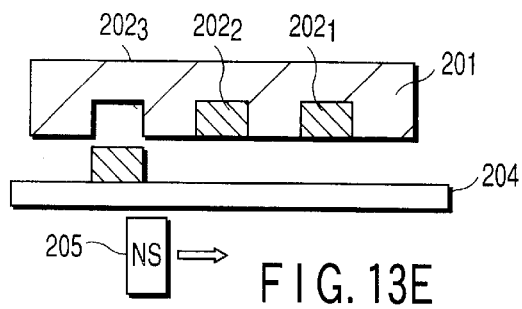
Figure 13F:
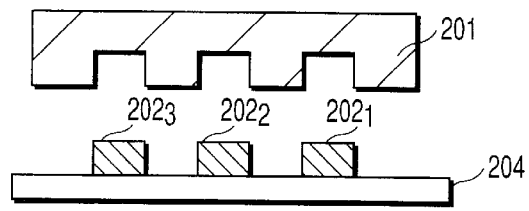

Next, as shown in FIGS. 13E and 13F, by disposing a magnet 205 under the substrate 204 subject to printing and by scanning with the magnet 205, the bumps 2021–2023 in the grooves 200 are made to be transferred onto the substrate 204 subject to printing with the patterns of the bumps 2021–2023 maintained.

Subsequently, the paste is baked to harden the bumps 2021–2023. In this case, the paste may be baked after carrying out the temporary drying process for the paste while maintaining the pattern of the bumps 2021–2023.

Thus, according to the present embodiment, by using the paste 202 containing the ferromagnetic substance, the transfer of the bumps 2021–2023, which are primarily embedded into the grooves and hard to be transferred, can be made easily by using the magnet 205.

In the following, a variation of the present embodiment will be described.

Figure 14:
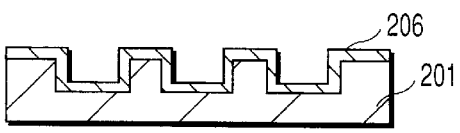
FIG. 14 shows another variation of the seventh embodiment.

FIG. 14 shows an example in which the surface of the metal substrate 201 is processed for easy separation therefrom by applying a water repellent, having repellency to the paste, thereto so that the bumps 2021–2023 can be removed more easily; 206 denotes the portion having processed for repellency. The processing for easy separation from the pattern is made, for example, by using fluorine. In this case, the portion 206 processed for easy separation from the pattern corresponds to the portion coated with fluorine.

Figure 15:
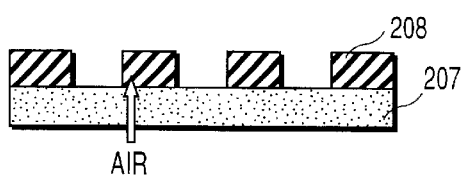
FIG. 15 shows another variation of the seventh embodiment.

FIG. 15 shows an example of a porous substrate 207, which permits the air to pass through and is provided with a mask 208 formed thereon for more easier separation of the bumps, as being a substrate to replace the metal substrate 201. The porous substrate 207 is formed from a sintered substance. The pattern of the opening of the mask 208 corresponds to the pattern of the bump. The material of the mask 208 may be either conductive material or insulation material.

In the figure, the porous substrate 207 is disposed on the underside, while the mask 208 is disposed on the top side, but the porous substrate 207 is moved to the top side, while the mask 208 is moved to the underside when discharging the bump. Therefore, the bump in the opening of the mask 208 is subjected to the atmospheric pressure due to the air passing through the porous substrate 207 when discharging the bump. Thus, the discharging of the bump can be made easier.

FIGS. 16A–16D show examples, in which bumps 2021–2023 are formed in an opening 210 of a mask 212 instead of forming the bumps 2021–2023 in the groove 200 of the metal substrate 201.

Figure 16A:
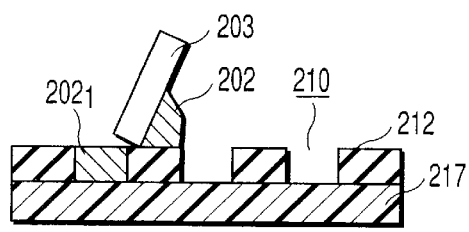
FIGS. 16A–16D show another variation of the seventh embodiment.
Figure 16B:
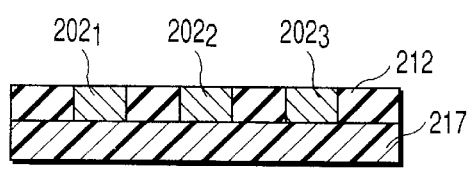

First, as shown in FIGS. 16A and 16B, after forming a mask 212 having an opening on a Teflon substrate 211, the opening 210 of the mask 212 is filled with the paste 202 to form the bumps 2021–2023. The material of the mask 212 is desired to be a material having a low adhesive property to the Teflon and repellency to the paste.

Figure 16C:
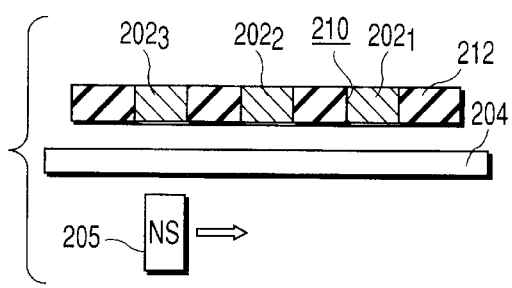
Figure 16D:
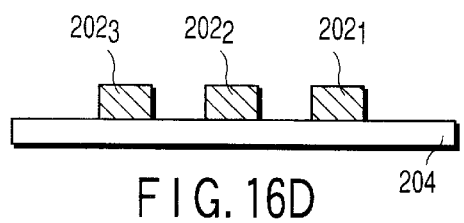

Next, as shown in FIGS. 16C and 16D, the bumps 2021–2023 in the opening 210 of the mask 212 are transferred onto the substrate 204 to receive the print by using the magnet 205. This process is similar to those shown in FIGS. 13E and 13F.

Figures 31A, 31B:
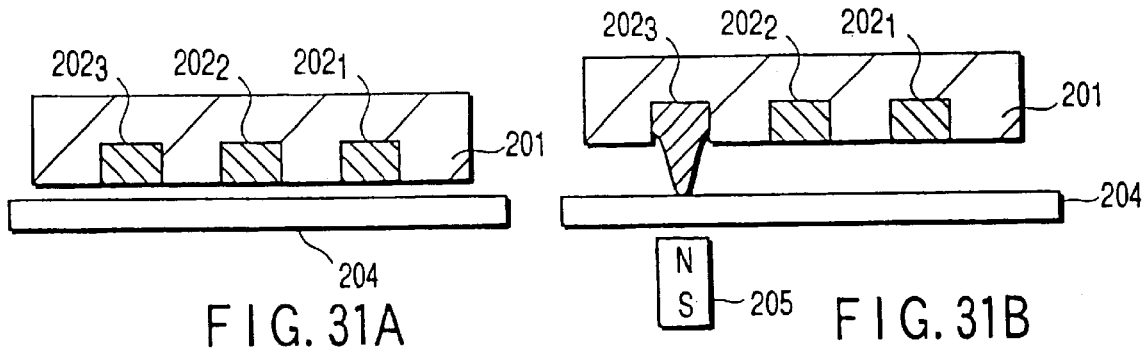
FIGS. 31A–31C show improved cases of the seventh embodiment.
Figure 31C:
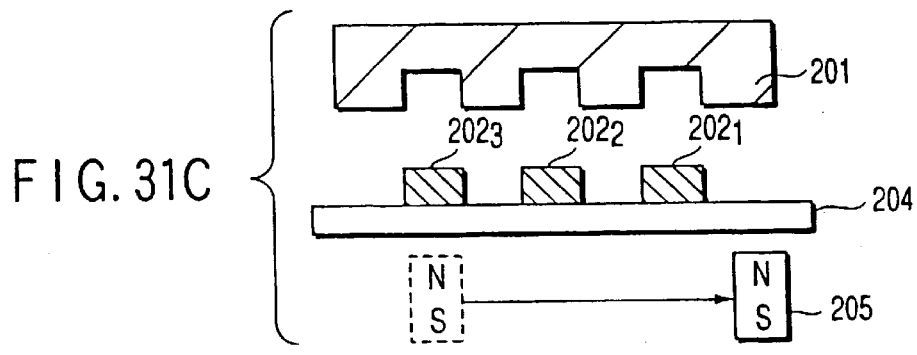

FIGS. 31A–31C are for illustrating the method for accurately transferring the bumps embedded into the grooves of the metal substrate onto the substrate to be printed. Of the grooves of the metal substrate 201, one at the center has a larger depth compared with those of neighboring ones. Consequently, the bumps 2021–2023 are tapered frontward respectively.

In the case where the bumps 2021–2023 are existing, when the magnet 205 is disposed under the substrate 204 subject to printing as shown in FIG. 31B, a magnetic field, whose intensity is greater at and around the central bump among the bumps 2021–2023, is produced. As a result, the area corresponding to the central bump among the bumps 2021–2023 is subject to a larger magnetic attraction.

Therefore, as shown in FIG. 31C, it becomes possible to accurately transfer the bumps 2021–2023 onto the substrate 204 without causing the bumps 2021–2023 to deviate towards the direction of scanning even when scanned with the magnet 205.

Figure 32:
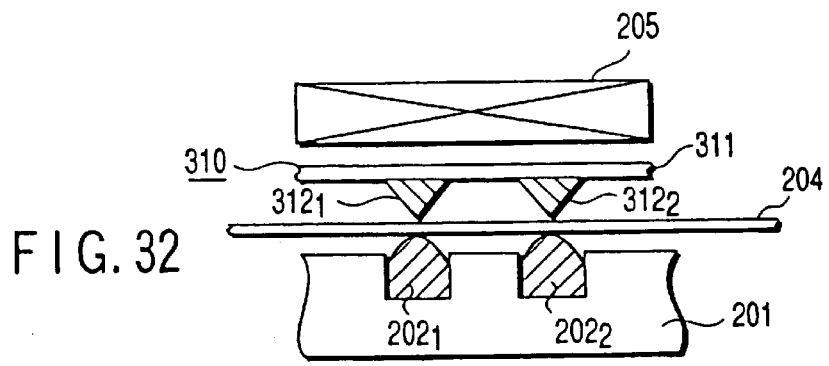
FIG. 32 shows an improved case of the seventh embodiment.

FIG. 32 illustrates another method for accurately transferring the bumps embedded into the grooves of the metal substrate. This method is designed so that a magnetic flux density control plate 310 is provided between the magnet 205 and the metal substrate 201 without changing the shapes of the bumps 2011–2023.

The magnetic flux density control plate 310 comprises a plate 311 and pointed protrusions 3121 and 3122 provided on the plate 311.

The points of the protrusions 3121 and 3122 are disposed opposite to the centers of the bumps 2021 and 2022 respectively. If the previously described magnetic substance is the main material of the protrusions 3121 and 3122, the protrusions 3121 and 3122 may include, for example, those of the magnets.

Here, for the brevity of explanation, the situation is illustrated where there are two control members and two bumps, respectively, but the same rule applies to the case where the number of these members and bumps are three or more, respectively. More particularly, in any of these cases, a corresponding magnetic flux density control member is provided on the central portion of each bump. The interval between each of the bumps 2021 and 2022 and each of the control members 3121 and 3122 is preferable to be as small as possible.

When the magnet 205 is placed on the substrate 204 subject to printing through the magnetic flux density control plate 310, the magnetic flux density is high at the central portion of each of the bumps 2021 and 2022, thereby causing the central portion of each of the bumps 2021–2023 to rise. When starting to rise, the increase in the magnetic flux density at the central portion of each bump is accelerated. Consequently, similar to the case illustrated in FIGS. 31A–31C, it becomes possible to accurately transfer the bumps 2021–2023 onto the substrate 204, which is subject to printing.

Figure 33:
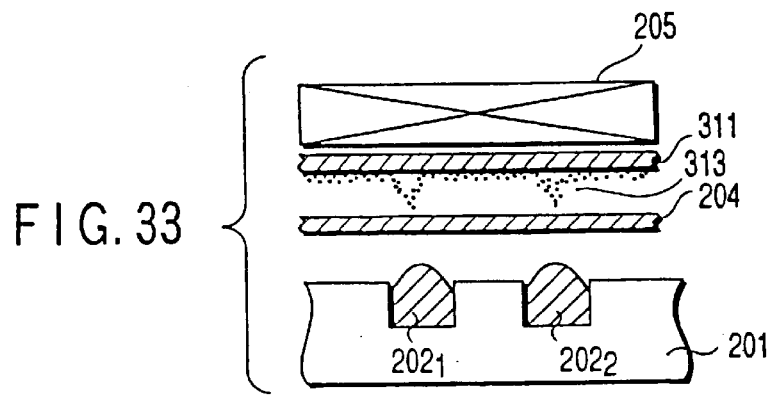
FIG. 33 shows another improved embodiment of the seventh embodiment.

FIG. 33 illustrates another method for accurately transferring the bumps 2021–2023 embedded into the grooves of the metal substrate 201 on the substrate 204 which is subject to printing. In this method, magnetic sand 313, as a magnetic flux density control member, is placed on the plate 311. In this case, as shown in the figure, the central portions of the bumps 2021 and 2022 are made to rise by means of the processing for facilitating the removal of the bumps from the pattern. Further, in the case shown in FIG. 32, the central portions of the bumps 2021 and 2022 need not be made to rise in the initial state, but they may be made to rise if necessary.

When the central portions of the bumps 2021 and 2022 have already been made to rise, the magnetic flux density at each of these points is high, so that the magnetic sand collects on the central portion corresponding to the raised points. As a result, the protrusions of the magnetic sand 313 corresponding to the central portions of the bumps are formed. Therefore, similarly to the case where the protrusions 3121 and 3122 are provided on the plate 311, the bumps 2021 and 2022 can be transferred accurately onto the substrate 204 which is subject to printing.

FIG. 34 illustrates another method for easily transferring the bumps onto the substrate to receive the transferred print. This method is characterized by two magnets 2051 and 2052 arranged so that the identical poles arranged opposing to each other are used for scanning. As shown in the figure, the magnetic flux density in the direction perpendicular to the metal substrate 201 at the central portions of the magnets 2051 and 2052 increases to increase the transferred amount of the paste. That is, the component of the magnetic flux density, which is necessary to discharge the bumps 2022 from the metal substrate 201, is increased, whereby it becomes possible to easily transfer the thick bump onto the substrate subject to printing. Further, it becomes unnecessary to reduce the interval between the bump and the substrate subject to printing. Further, as shown in FIG. 35, the same effect can be obtained by scanning with the magnets 2051 and 2052 disposed only on the substrate 204 subject to printing.

To enhance the effect described above, it is desirable to dispose the magnets 2051 and 2052 above the substrate 204 subject to printing too so that the scanning can be made by using upper magnets 2051 and 2052, and the lower magnets 2051 and 2052, which are synchronized with each other as shown in FIG. 36.

Furthermore, depending on the method (e.g., B2 IT method) to be employed in the present invention, it is necessary to prevent the deterioration of the transferred bumps by increasing the viscosity of the magnetic paste to a certain extent.

Where the viscosity of the magnetic paste is high, it is hard to transfer the bump onto the substrate subject to printing unless the intensity of the magnetic force is increased. The present inventors have developed a method by using an ultrasonic wave as one of the methods for effectively reducing the viscosity of the magnetic paste. This method is one utilizing the cavitation by the ultrasonic wave. When it is desired merely to reduce the viscosity, the frequency range of the ultrasonic wave may be 18–100 kHz, while the power may be 0–50 W/cm$^2$.

However, reducing the viscosity of the magnetic paste by using the method described above can give rise to a problem that the bumps deviate in the direction of scanning during the process for transferring the bumps onto the substrate subject to printing. This is caused because the friction between the metal substrate and the bumps is reduced due to the effect of the cavitation.

To overcome the above problem, it is effective to apply the ultrasonic wave with frequency of 100 kHz or more, which will not cause the cavitation, to the bumps though the effect of the reduced viscosity of the magnetic paste decreases. By doing so, even when the magnetic paste having a high viscosity is used, it becomes possible to transfer the bumps onto the substrate subject to printing without increasing the magnetic force of the magnet.

Figure 37A:
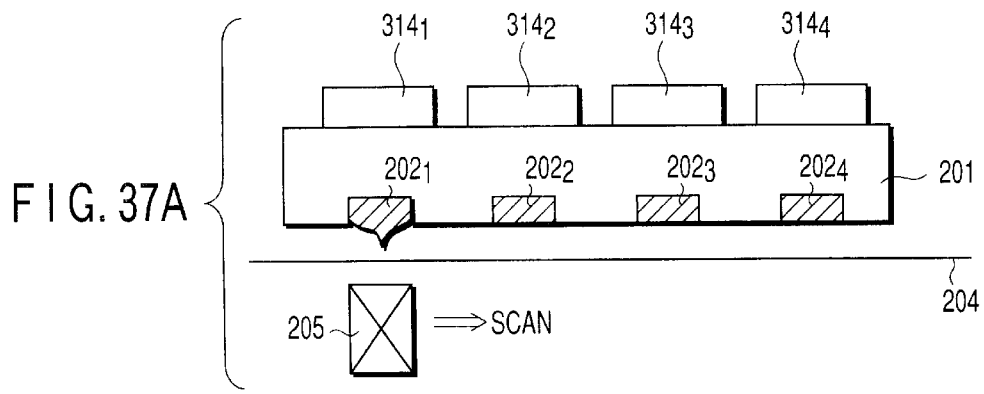
FIGS. 37A–37B show improved embodiments of the seventh embodiment.

The ultrasonic wave is applied during the period in which the magnets are at rest, that is, the period in which the magnets and the bumps are kept opposite to one another. During the period in which the magnet is moving to the next bump, the ultrasonic wave is not applied. In order to carry out such an ultrasonic wave application method, for example, as shown in FIG. 37A, ultrasonic wave vibrators 3141–3144 are fixed respectively corresponding to the bumps 2021–2024 included in the metal substrate 201. Where the member above a magnet 205 is kept at rest, only the corresponding ultrasonic wave vibrator located above is operated, while other ultrasonic wave vibrators are kept at rest. During the transfer of the magnets, all the ultrasonic wave vibrators kept at rest.

Figure 37B:
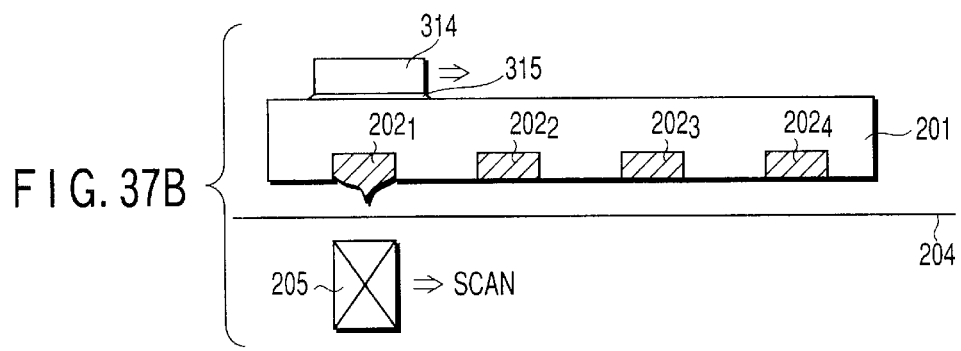

In a variation of this embodiment, regardless of whether the magnets are at rest or moving, the ultrasonic wave is always applied to the range over the magnets. In order to practice such an application method, for example, as shown in FIG. 37B, scannable ultrasonic wave vibrator 314 and ultrasonic wave vibration member 315 are provided on the metal substrate 201. The ultrasonic vibration member 315 may be one, for example, formed from a rubber material. The ultrasonic vibration member 315 need not necessarily be formed from the solid material; it may be formed, for example, by using liquids including water. More specifically, any material, which allows the ultrasonic wave vibrator to come into close contact with it through the underlying material, may be used. By doing so, the ultrasonic wave vibration can be applied to the underlying material for enabling the viscosity to be reduced effectively. The ultrasonic wave vibration member 315 may be disposed under the ultrasonic wave vibrators 3141–3144.

As another method for reducing the viscosity of the magnetic paste, there is one in which the magnetic paste is heated. In this method, it is important to keep the substrate subject to printing at a constant temperature so that the mismatching of the transfer due to the thermal deformation of the substrate subject to printing and the metal substrate can be prevented. The transfer of the magnetic paste onto the substrate subject to printing is greater in transfer rate and ease of transfer, where the temperature of the substrate subject to printing is set lower than that of the metal substrate. Further, the transfer of the bump can be made easier by combining the method by using the ultrasonic wave and the method by using heating.

Sometimes, it gives rise to a problem that the magnetic substance in the bump is magnetized after being transferred onto the substrate subject to printing. As one of the methods to solve this problem, the magnetic substance is demagnetized by heat treatment after the bump is transferred. Therefore, the bump, which has been transferred, includes the non-magnetic conductive paste, which includes the demagnetized magnetic substance. In another method, the magnetic substance is used whose Curie temperature is lower than the temperature of the environment in which the bump is used. In this method, the magnetic member loses its magnetic property before the bumps are transferred to it. Hence, the member need not be demagnetized after the bumps are transferred to it.

Further, sometimes, the existence of the magnetic substance in the bump itself becomes a problem. For instance, there is a case where the magnetic substance in the solder bump acts as a reactive component and becomes a hindrance to signal transmission. For instance, this gives rise to a problem such as an adverse effect on the waveform of a high-frequency signal.

To overcome such a problem, it is effective to remove the magnetic substance from the bump after transferring the bump or convert the magnetic substance into non-magnetic substance. As a method for removing the magnetic substance from the bump after transferring the bump, for example, in the case of the bump including Ag—Sn solder, it is effective that Fe powder and the like, as a magnetic substance, is mixed into the Ag—Sn solder bump, and the magnetic substance in the Ag—Sn bump is made to resolve into the flux at the stage of re-flow following the transfer. As another method, there is one in which a magnetic substance and other material that will not form any alloy and the like with the magnetic substance are used, and the magnetic substance alone is deposited out of the bump by the heat treatment such as re-flow following the transfer.

On the other hand, as another method for converting the magnetic substance into a non-magnetic substance, for example, there is one, in which, a paste, comprising Ni, as a magnetic substance, and Si, as an additive, is used. The heat treatment following the transfer of the bump causes the Si and Ni to react with each other to form Ni silicide. That is, the Ni having magnetic property changes into the Ni silicide without the magnetic property. Many of the compounds with the magnetic substance are non-magnetic or weakly magnetic. Therefore, the Ni may be converted into a compound other than metallic silicide. For instance, a paste comprising Ni as a magnetic substance, and comprising Cu or Sn as an additive, is used, and, after transferring the bump, the Ni is converted into a Ni—Cu alloy or Ni—Sn alloy through the heat treatment of the Ni in the bump. Further, Si and Sn may be used as additives.

Sometimes, it is hard to obtain a primarily desired property because of the occurrence of the reaction of the magnetic substance with other principal substances in the bump. More specifically, in the case of the Sn—Pb solder bump, if Fe is added as a magnetic substance, the Fe reacts with Sn in the stage of re-flow to form an Fe—Sn compound, thereby reducing the strength of the solder. As a result, the reliability of the Sn—Pb solder bump declines. To resolve the above problem, it is effective to coat the surface of Fe with a barrier film such as those of $Al_2O_3$, polyimide resin, epoxy resin, $SiO_2$, $Fe_2O_3$ and the like, which will not react with Sn. The thickness of the barrier coating should not be too large, since too large a thickness of the barrier coating reduces the magnetic force acting on Fe.

Where such coated Fe is added, the amount of Fe—Sn compound decreases, so that the above problem can be resolved. This method, characterized by coating the magnetic substance, is confirmed to be effective in the case of the paste mainly comprising Cu.

Further, since this embodiment is of the fine pattern comprising a plurality of bumps (conductive members), a conductive paste is used, but, in the case of the embodiment of the fine pattern comprising a plurality of bumps (conductive member), an insulation paste containing a magnetic substance is used. For instance, such an insulating paste may contain a magnetic body covered with an insulating material, or an insulation material is used for the main material, with a magnetic material used as an additive.

Figure 38A:
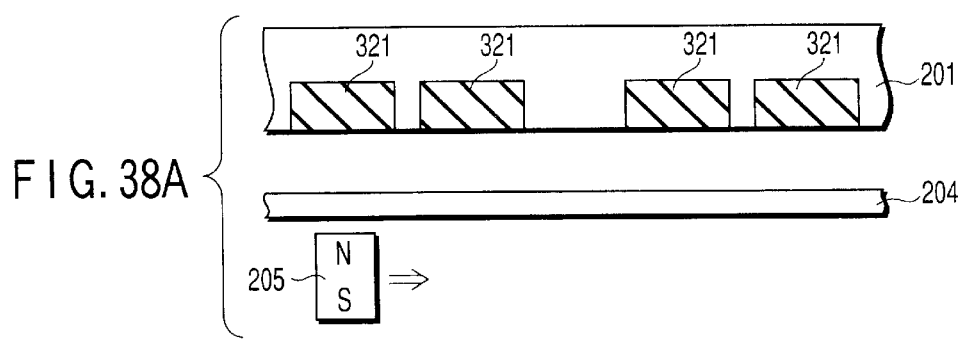
FIGS. 38A–38B show other variations of the seventh embodiment.
Figure 38B:
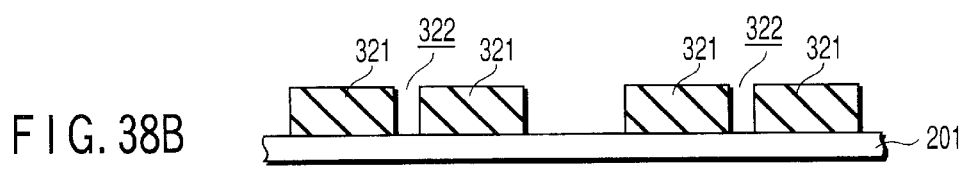

This kind of paste is, for example, shown in FIGS. 38A–38B, used for forming an interlayer insulating film 321 having fine through-holes to the electrode (not shown) formed on the substrate subject to the printing. According to the foregoing description, the form of the groove of the metal substrate corresponds to the bump, but, in the cases of FIGS. 38A–38B, the form of the groove in the metal substrate 210 corresponds to the insulating film 321 having the through hole 322.

Further, by making the form of the groove in the metal substrate 210 correspond to the wiring, similarly to the case of the bump, a fine wiring pattern can easily be formed by transferring the conductive paste, that is, the wiring, onto the substrate which is subject to printing (such as the substrate or the chip).

In short, by properly selecting the form of the groove and the kind of the paste, various patterns can be formed. More particularly, this embodiment relates to a semiconductor manufacturing system, comprising a process for applying the paste, mainly comprising a magnetic substance and the materials (e.g., conductive material in the case of the wiring or plug) corresponding to the pattern (e.g., wiring or plug) to be formed on the surface, to the surface of a first substrate to fill the groove with the paste, a process for removing the paste remaining on the outside of the groove, a process for forming the pattern by applying either a hardening process or baking process to the paste and a process for transferring the pattern embedded into the groove onto a second substrate other than the first substrate to remove the pattern from the first substrate, wherein a magnetic field is generated for drawing the paste into the groove when applying the paste for being embedded into the groove and when transferring the embedded paste into the groove of other substrate.

The Eighth Embodiment

FIGS. 17A–17F are sectional views showing the pattern forming process relating to the eighth embodiment of the present invention. Here, the explanation will be made as to the forming process of a plurality of bumps as a pattern forming process, but the same process is applicable for the forming of a plurality of plugs or wirings. This embodiment is characterized by that the bumps are transferred by means of electric field, that is, by charging the paste with static electricity while applying electric voltage to a metal substrate.

First, a metal substrate 222 is provided, the substrate 222 having grooves 220 formed on the surface thereof and an insulation film covering the surface thereof. The metal substrate is connected to a power source 223 of either d-c power or a-c power.

The groove 220 is 5–200 $\mu$m deep and 5–200 $\mu$m wide. The pattern of the groove 220 corresponds to the pattern of the bump. The insulation film 221 is 1 $\mu$m thick or more, and the metal substrate is 500 $\mu$m thick. The metal substrate 222 can be formed by using the galvanizing method, and the material, for example, may be Al.

Figure 17A:
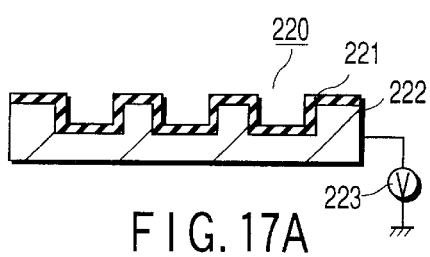
FIGS. 17A–17F show the pattern forming method relating to the eighth embodiment of the present invention.
Figure 17B:
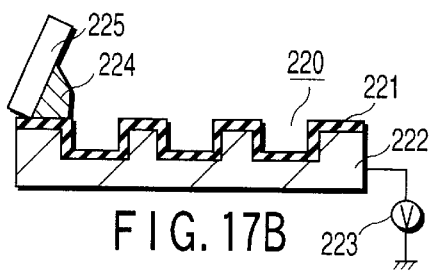
Figure 17C:
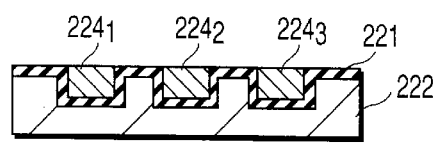

Next, as shown in FIGS. 17B and 17C, the conductive paste 224 is applied onto the metal substrate 222; the squeegee is moved from side to side until the paste 224 is completely embedded in the groove 220; and the paste remaining on the outside of the groove 220 is removed. As a result, the bumps 2241–2243 are formed from the paste 224.

To form voidless solid bumps 2241–2243, it is effective to draw the paste 224 into the groove 220 by the force of the electric field by making the paste 224 charged with electricity by turning on the power source 223 for utilizing an ionizer, electron beam and the like when embedding the paste 224 into the grooves 220.

Where the voltage power source is of d-c current, the voltage power source is connected to the metal substrate 222 so that the potential of the metal substrate 222 becomes negative when the paste 224 is electrified positively, while the potential of the metal substrate 222 becomes positive.

Subsequently, the bumps 2241–2243 are electrified positively or negatively by using the ionizer, electron beam and the like. The figures show the positively electrified state.

When embedding (the paste) into the groove 220, it is not always necessary to electrify the paste, provided that the electrified paste 224 is used. However, it is desirable to electrify the bumps 2241–2243 if the electrification is known to be too low or ineffective.

Further, the figure shows only three bumps 2241–2243 for brevity, but actual system comprises a greater number of bumps.

Figure 17D:
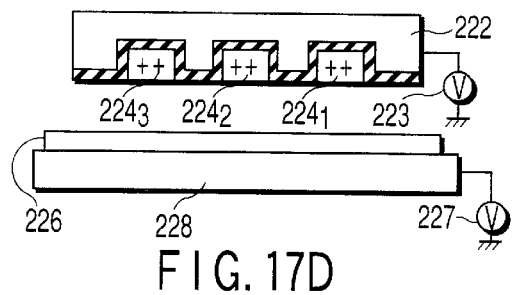

Next, as shown in FIG. 17D, the surface into which the bumps 2241–2243 are embedded is disposed facing downward, while the metal substrate 222 is disposed horizontally above the substrate subject to printing. The interval between the metal substrate 222 and the substrate 226 subject to printing is about 50–100 $\mu$m.

In this case, as shown in FIG. 17D, the substrate subject to printing may be placed on stage 228 that is connected to voltage source 227. The voltage source 227 is connected to the stage 228 so that the potential of the substrate 226 subject to printing can be reversed to the potential of the metal substrate 222.

In this embodiment, the metal substrate 222 and the substrate 226 subject to printing are disposed opposing each other leaving a certain clearance therebetween, but the metal substrate 222 and the substrate 226 subject to printing may be disposed in contact with each other.

Figure 17E:
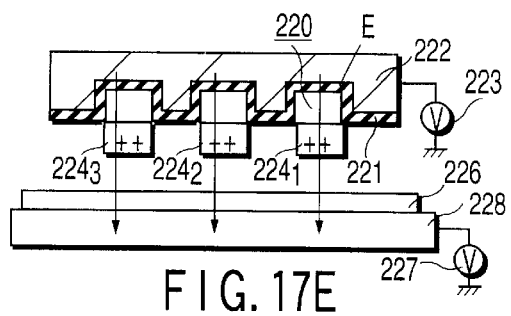
Figure 17F:
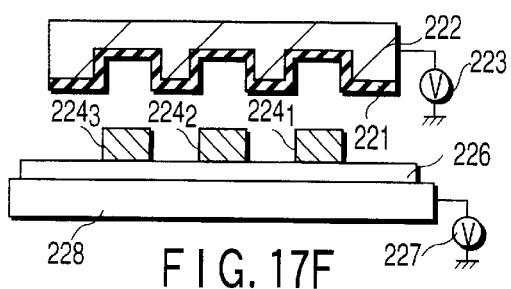

Next, as shown in FIGS. 17E and 17F, the voltage source 223 is turned on; the surface potential of the substrate 226 subject to printing is reversed to the potentials of the bumps 2241–2243 to generate electric field E; the bumps 2241–2243 deformed and moved along the electric field E to discharge the bumps 2241–2243 from the groove 220 for being transferred onto the substrate 226 subject to printing with the pattern maintained. Subsequently, the bumps 2241–2243 are hardened by baking.

Where the substrate 226 subject to printing is mounted on the stage 228, which is connected to the voltage source 227, the power source 227 is turned on, and the bumps 2241–2243 are moved towards the substrate 226 subject to printing by the force of the electric field E. By doing so, it becomes possible to transfer the bumps 2241–2243 onto the substrate 226 subject to printing.

In this case, when using the d-c voltage source as the voltage source 227, the voltage source 227 is connected to the substrate 226 subject to printing so that the potential of the substrate 226 subject to printing is charged negatively when the bumps 2241–2243 are charged positively, while the potential of the substrate 226 subject to printing are charged positively when the bumps 2241–2243 are charged negatively.

Thus, according to the present embodiment, by electrifying the bumps 2241–2243, it becomes possible to easily transfer the bumps 2241–2243 embedded in the groove, which is hard for the removal of the bump, onto the substrate 226 subject to printing.

Further, in this embodiment, similar to the case of the seventh embodiment, where the fine pattern comprises a plurality of insulation members, the insulation paste is used.

The Ninth Embodiment

FIGS. 18A–18E are sectional views of the pattern forming processes relating to the ninth embodiment of the present invention. Here, the explanation will be made as to the pattern forming process for Cu wiring, but this process is also applicable to the formation of other patterns. According to the embodiment shown in FIGS. 7 and 8, the pattern is formed by the screen printing method, but, according to the present embodiment, the pattern is formed by the galvanizing method.

Figure 18A:
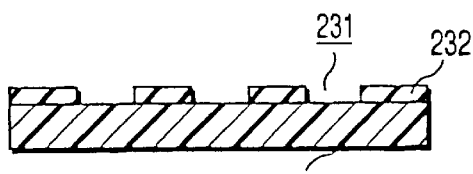
FIGS. 18A–18E are sectional views of the materials to be processed relating to the ninth embodiment of the present invention.

First, as shown in FIG. 18A, an insulation film having openings 231 is formed on the area for the Cu wiring formation of the Ni-Teflon composite substrate 230.

Figure 18B:
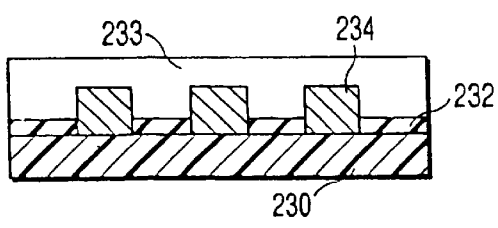

Next, as shown in FIG. 18B, Cu wiring 324 is formed on the Ni-Teflon composite substrate 230 by the galvanizing process by using a cloth 233 (cloth impregnated with galvanizing material). Later, the cloth 233 is removed.

Figure 18C:
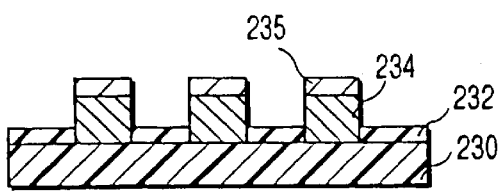

Next, as shown in FIG. 18C, paste 235 is applied onto the Cu wiring 234. As the method for applying the paste 235, the screen printing method is available. As for other methods, the transfer method is available, in which, after applying the paste 235 all over the surface of another substrate, the substrate 230 is pressed against another substrate so that the Cu wiring 234 comes into contact with the Cu wiring, thereby transferring the paste 235 onto the Cu wiring 234.

Figure 18D:
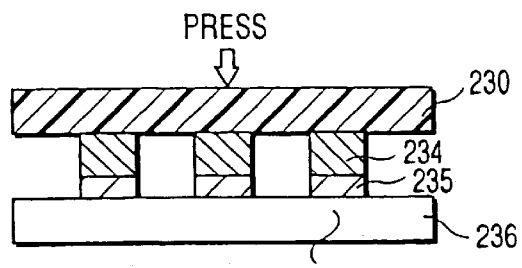

Next, as shown in FIG. 18D, there is yet another method, in which after increasing the viscosity of the paste 235 by half-hardening the paste 235, the Ni-Teflon composite substrate 230 is pressed against the glass-epoxy substrate 236 so that the paste 235 adheres to the glass-epoxy substrate 236.

Further, the figure shows the case where the Cu wiring and the bump 237 formed in the glass-epoxy substrate 236 are brought into contact with each other if necessary (in the case of multi-layer wiring), in which case, the paste 235 is required to have conductivity.

However, the paste 235 need not have conductivity in the case where the bump is not formed in the glass-epoxy substrate 236 (the case of single-layer wiring). Consequently, a bonding agent including the epoxy resin or the like may be used for the paste 235.

Figure 18E:
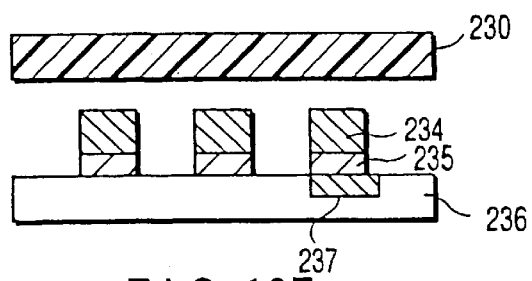

Next, as shown in FIG. 18E, the Cu wiring 234 is separated from the Ni-Teflon composite substrate 230 so that the Cu wiring 234 including the paste 235 is transferred onto the glass-epoxy substrate 236. In this case, since the closeness of the contact between the Ni-Teflon composite substrate 230 and the Cu wiring 234 is low, the Cu wiring can easily be separated from the Ni-Teflon composite substrate 230.

As discussed in the foregoing, according to the present embodiment, the Cu wiring, formed on the Ni-Teflon composite substrate 230 by the galvanizing method by using the cloth, is transferred onto the glass-epoxy substrate 236 to form the Cu wiring 234 onto the glass-epoxy substrate 236.

Therefore, according to the present embodiment, the process for forming the Cu film on the glass-epoxy substrate 236, the lithographic processing of the Cu film and the etching process for the Cu film can be omitted, so that the glass-epoxy substrate 236 provided with the Cu wiring 234 can be obtained by using a simplified process.

Further, according to the present embodiment, the Cu wiring is formed by the galvanizing method including the use of the cloth 233, but other galvanizing methods may be used. Further, a similar effect can be obtained by using the Si substrate or the ceramic substrate.

The Tenth Embodiment

FIGS. 19A–19E are sectional views showing the pattern forming methods relating to the tenth embodiment of the present invention. Here, the explanation will be made as to the method for forming the pattern of the Cu wiring, but this method is also applicable to the formation of other patterns.

Figure 19A:
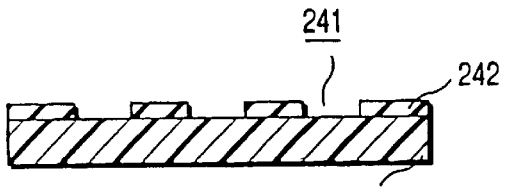
FIGS. 19A–19E are sectional views of the materials to be processed relating to the tenth embodiment of the present invention.

First, as shown in FIG. 19A, the polyimide film 242 having the opening 241 is formed in the area, on which the bumps are to be formed, on the Ni-Teflon composite substrate 240.

Figure 19B:
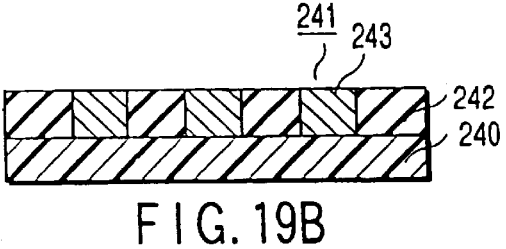

Next, as shown in FIG. 19B, the Cu wiring 243 is selectively formed in the opening 241 by using the galvanizing method. Further, in the figure, the upper surface of the Cu wiring 243 and the surface of the opening 241 are disposed flush with each other, but, in practice, it is desirable that the upper surface of the Cu wiring 243 is set a little higher (1 $\mu$m or less) than the level of the opening 241.

Figure 19C:
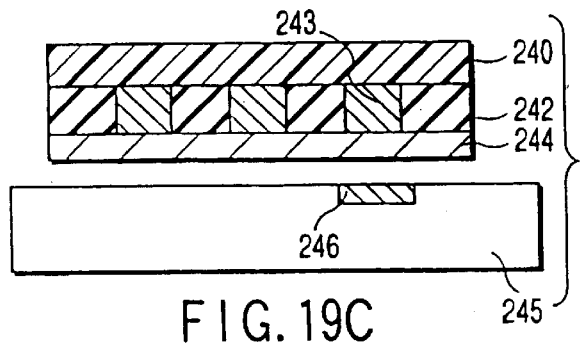

Next, as shown in FIG. 19C, after forming an anisotropic conductive sheet 244 all over the surface of the side on which the Cu wiring 243 is formed, the Ni-Teflon composite substrate 240 is disposed above the glass-epoxy substrate 245 with the side on which the anisotropic conductive sheet 244 is formed facing downside. In the figure, 246 denotes the bump formed in the glass-epoxy substrate 245.

Figure 19D:
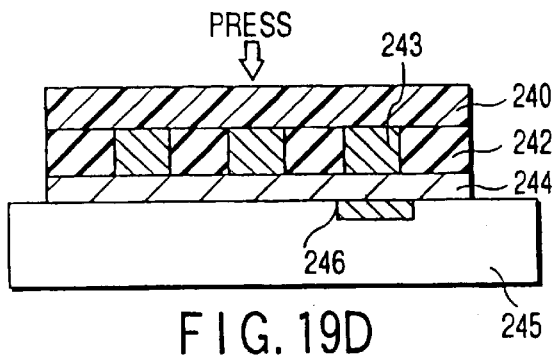

Next, as shown in FIG. 19D, the Ni-Teflon composite substrate 240 is pressed against the glass-epoxy substrate 245 to let the anisotropic conductive sheet 244 attached onto the glass-epoxy substrate 245.

Figure 19E:
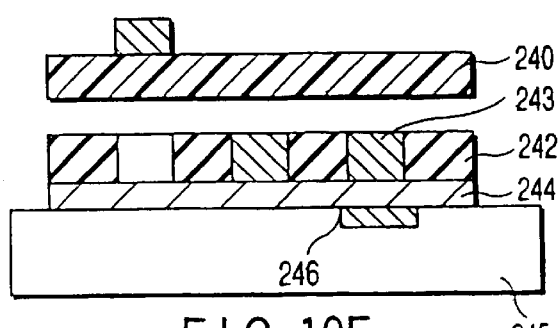

Next, as shown in FIG. 19E, the Ni-Teflon composite substrate 240 is separated from the glass-epoxy substrate 245. In this case, the Ni-Teflon composite substrate 240 can be separated easily, since the adherence between the Ni-Teflon composite substrate 240 and the Cu wiring 243 is low.

As discussed in the foregoing, according to the present embodiment, the Cu wiring 243 is formed on the glass-epoxy substrate 245 by making the Cu wiring, formed on the Ni-Teflon composite substrate 240 by the galvanizing method, come into contact with the glass-epoxy substrate 245 through the anisotropic conductive sheet 244.

Therefore, according to this embodiment, the process for Cu film formation on the glass-epoxy substrate 245, lithographic processing of Cu film and etching processing of Cu film can be omitted, so that the glass-epoxy substrate with the Cu wiring provided thereon can be obtained by simplified processing.

Further, when the plug 246 need not be formed in the glass-epoxy substrate 245 (the case of single-layer wiring), an anisotropic sheet with insulating ability may be used instead of the anisotropic insulating sheet. Further, the similar effect can be obtained when a Si substrate or a ceramic substrate is used instead of the glass-epoxy substrate 245.

The Eleventh Embodiment

Figure 22:
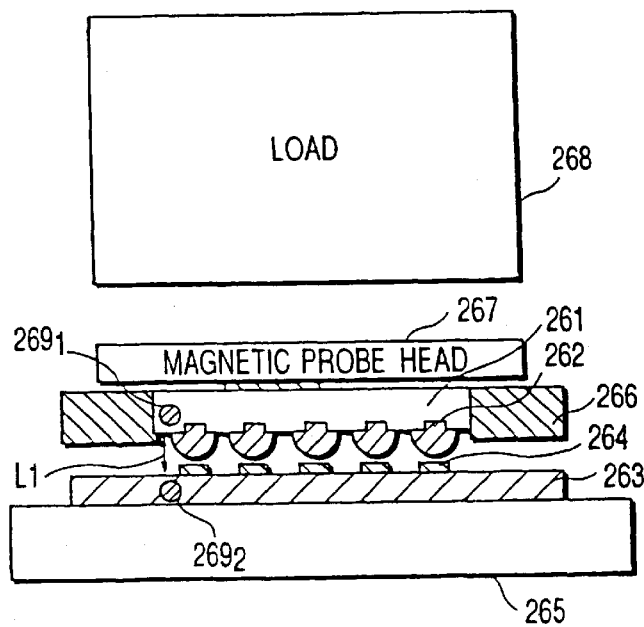
FIG. 22 is a schematic view showing a bonding system relating to the eleventh embodiment of the present invention.

FIG. 22 is a schematic view showing the bonding system relating to the eleventh embodiment of the present invention.

The bonding system according to this embodiment is characterized in that accurate bonding can be realized by utilizing the magnetic body for positional matching between the chip and the substrate.

In the figure, 261 denotes a chip, on which bump 262 including a magnetic substance is formed. The bump 262 is formed, for example, by the forming method described in connection with the seventh embodiment. Further, in the figure, 263 denotes a substrate, in which a pad 264 including a magnetic substance is formed.

The bonding system according to the present embodiment is designed for bonding the chip 261, which includes connecting members 262 and 264 containing the magnetic substance, with the substrate 263, the bonding system comprising mainly the substrate 263 mounted thereon, XY-θ stage 265, which is capable of moving in three (different) directions, a chip carrier 266, which holds the chip 261 and is capable of moving to the XY-θ stage 265, a magnetic probe head 267, which detects the magnetic field generated by the magnetic substance contained in the bump 262 and the pad 264, a computer (not shown) for determining the bump 262 and the pad 264, a controller (not shown) for controlling the position of the XY-θ stage 265 so that the positions of the bump 262 and the pad 264 coincide with each other, and a load 268 for forcing the chip 261 to be pressed against the substrate 263.

The above computer may be a general-purpose computer, e.g., a personal computer, or a dedicated computer for determining only the locations of the bump 262 and the pad 264. Further, according to the present embodiment, the position of the XY-θ stage 265 is controlled in determining right position, but the chip carrier 266 may be controlled for the same purpose, or the both may be controlled.

Next, the explanation will be made as to the bonding procedure by using the bonding system having a configuration as described above.

First, place the substrate 263 on the XY-θ stage.

Then, move the chip carrier 266 holding the chip 261 thereon to place the chip 261 on the substrate 263. In this case, the distance L1 between the chip 261 and the substrate 263 should be 1 mm.

Next, let the magnetic probe head 267 scan the chip 261 from above to detect the magnetic fields generated by the magnetic substance contained in the bump 262 and the pad 264 respectively.

Next, the locations of the bump 262 and the pad 264 are determined (Step 1) by the computer based on the result of the detection by the magnetic probe head 267.

Figure 23:
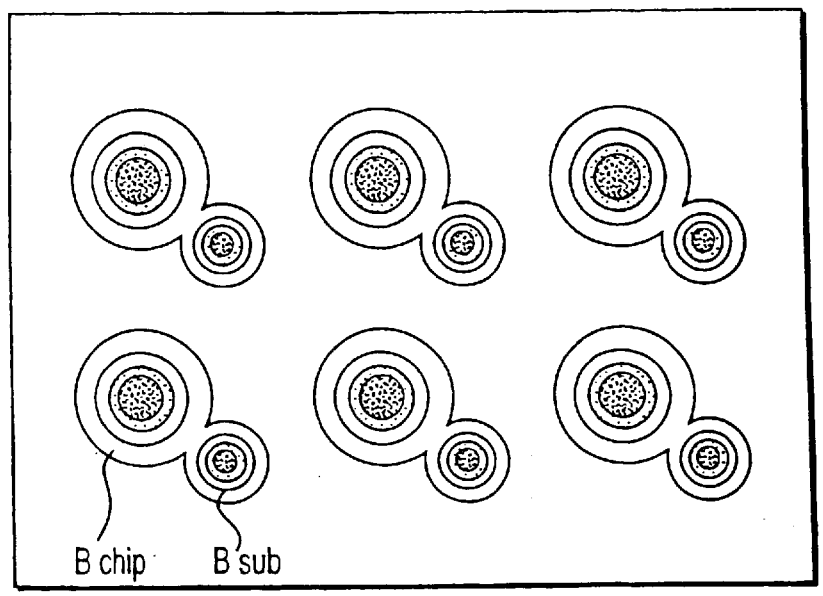
FIG. 23 is a diagram showing the distribution and intensity of the magnetic field detected by magnetism probe head and respectively represented by contour line on the basis of the x-axis and y-axis of rectangular coordinates.

The locations of the bump 262 and the pad 264 are determined by the procedure given below. FIG. 23 is a diagram showing the graphical distribution of the magnetic field and intensity of the magnetic field on the x-axis and y-axis expressed in terms of the contour lines.

In the figure, B chip represents the magnetic field generated by the magnetic substance contained in the bump 262 of the chip 261 while B sub represents the magnetic field generated by the magnetic substance contained in the pad 264 of the substrate 263.

When the magnetic substance in the bump 262 and that in the pad 264 are identical, the magnetic field B chip and the magnetic field B sub differ from each other, since the size of the bump 262 differs from the size of the pad 264. Further, that the bump 262 is closer to the magnetic probe head also causes the magnetic field B chip and the magnetic field B sub to differ from each other. Further, even when the magnetic substance in the bump 262 differs from that in the pad 264, it is possible to make the magnetic field B chip and B sub detected by the magnetic probe head differ from each other.

It is possible to make the position of the bump 262 the peak position of the magnetic field B chip and to make the position of the pad 264 the peak position of the magnetic field B sub. Therefore, the positions of the bump 262 and the pad 264 can be determined by determining the peak position of the magnetic field B chip and the peak position of the magnetic field B sub by the computer by graphically representing the distribution of the magnetic field, shown in FIG. 23, on the x-axis and y-axis and the intensity of the magnetic field in terms of contour lines based on the result of the detection by the magnetic probe head 267.

Next, the position of the XY-θ stage 265 is controlled by the controller so that the two peak positions coincide with each other (Step 2).

Next, the step S1 is repeated to determine the two peak positions and whether the difference between them is smaller than the predetermined value or not (step 3).

When the difference between the two peak positions is smaller than the predetermined value, chip 261 is lowered by using the chip carrier 266 to let the chip 261 be pressed against the substrate 263 by the force of the load 268, thereby effecting the bonding of the chip 261 and the substrate 263 to each other (Step 4).

When the difference between the two positions is larger than the predetermined value, the steps, S1 through S3 are repeated for the feedback control. Subsequently, the step S4 is executed.

Thus, according to the present embodiment, the magnetic fields generated by magnetic substance contained in the bump 262 and the pad 264 are utilized for detecting the positions of the bump 262 and the pad 264, whereby the positional matching of the chip 261 and the substrate 263 can be accomplished through a small distance (L1=1 mm). As a result, the positional mismatching between the chip 261 and the substrate 263 at the time of the positional matching and bonding can be reduced sufficiently for accomplishing accurate bonding.

Further, according to the present embodiment, the bump 262 and the pad 264, each containing the magnetic substance, are used, but, as shown in FIG. 22, the chip 261 and the substrate 263 may contain the magnetic substance 2691 and 2692 respectively so that the magnetic field generated by each of these magnetic substances can be utilized for detecting the positions of the bump 262 and the pad 264 respectively.

The Twelfth Embodiment

Figure 24:
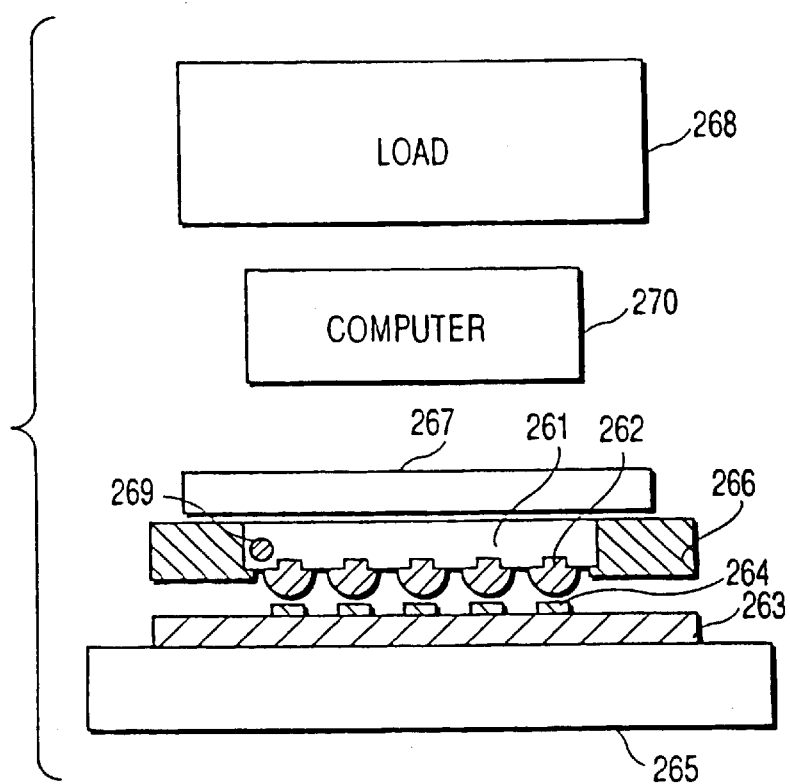
FIG. 24 is a schematic view showing a bonding system relating to the twelfth embodiment of the present invention.

FIG. 24 is a schematic view showing a bonding system relating to the twelfth embodiment of the present invention.

Further, the same numerals are assigned to the members common to those in FIG. 22, and the detailed descriptions thereof are therefore omitted here.

According to the present embodiment, only the magnetic field generated by the magnetic substance contained in the bump 262 is detected. Therefore, the pad 264 need not to contain the magnetic substance.

First, the substrate 263 is placed on the XY-θ stage.

Next, the relative position of the substrate 263 to the pad 264 is determined with respect to any given point (origin) of the XY-θ stage is determined, and the determined relative position is stored in the computer.

Next, the chip 261 is brought above the substrate 263 by the chip carrier 266. In this case, the distance between the chip 261 and the substrate 263 should be 15 mm.

Then, the magnetic probe head is made to scan over the chip 261 to detect the magnetic field generated by the magnetic substance contained in the bump 262.

Next, based on the result of the detection by the magnetic probe head 267, the position of the bump 262 is determined by the computer 270 (Step S1).

Next, based on the position of the bump 262 determined in the step S1 and the relative position of the pad 264 stored in the computer 270, the position of the XY-θ stage is controlled by the controller so that the position of the bump 262 coincides with the position of the pad 264 (Step S2).

Then, repeat the step S1 to determine the position of the bump 262 and the positional difference between the bump 262 and the pad 264, and whether the difference is smaller than the predetermined value or not (Step S3).

If the difference is smaller than the predetermined value, the chip 261 is lowered by the chip carrier 266, and the bonding between the chip 261 and the substrate 263 is effected by making the chip 261 pressed against the substrate 263 by the force of the load 268 (Step S4).

If the above difference is greater than the predetermined value, the steps S1 through S3 are repeated until the difference becomes smaller than the predetermined value for the purpose of the feedback control. Then, the process proceeds to step S4.

Similar to the eleventh embodiment, according to the present embodiment, the positional matching between the chip 261 and the substrate 263 can be effected while the both are disposed very close to each other (L1=15 mm). Consequently, the positional mismatching between the chip 261 and the substrate 263 at the time of the positional matching and the bonding can be reduced sufficiently for enabling accurate bonding.

The Thirteenth Embodiment

Figure 25:
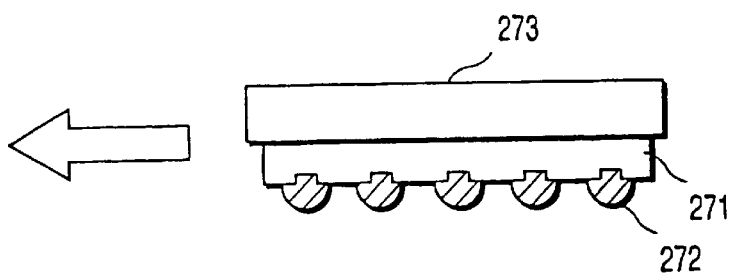
FIG. 25 is a schematic view showing a transfer system relating to the thirteenth embodiment of the present invention.
Figure 26:
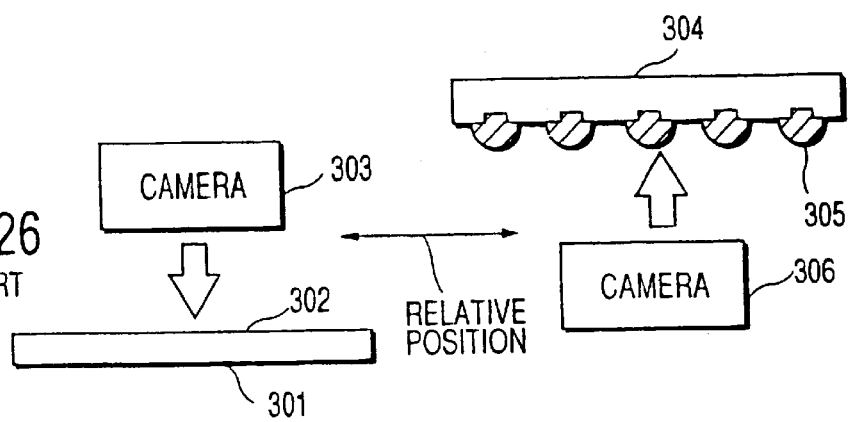
FIG. 26 shows a conventional matching method between a substrate and a chip.
Figure 27:
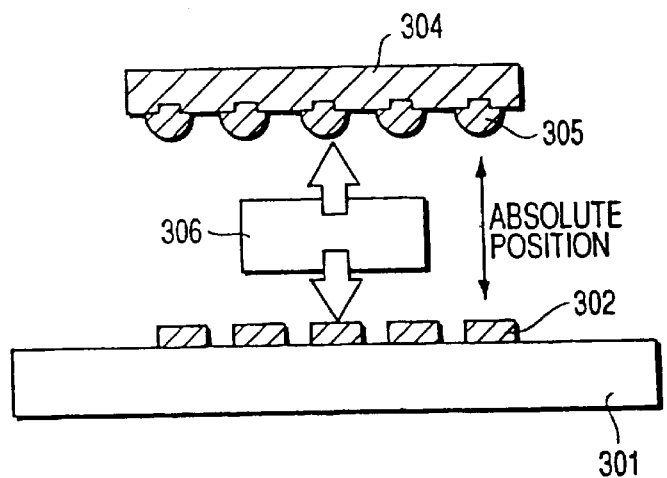
FIG. 27 shows a conventional matching method between a substrate and a chip.

FIG. 25 is a schematic view showing the transfer method relating to the thirteenth embodiment of the present invention.

In the figure, 271 denotes the member to be transferred of the substrate or chip, and the member 271 to be transferred is provided with a magnetic substance 272.

If the member 271 to be transferred is a substrate, the pad containing the magnetic substance can be used as the magnetic body 272, while if the member 271 to be transferred is the chip, the bump containing the magnetic substance can be used as the magnetic body 272. In these cases, the structure and process can be prevented from becoming complex, since the magnetic body 272 need not be provided additionally.

According to the present embodiment, as shown in FIG. 25, by disposing an electromagnet 273, as a holding member, above the member 271 to be transferred, the member 271 to be transferred can be held by the electromagnet 273 by the magnetic force acting between the magnetic body 272 and the electromagnet 273. By transferring the electromagnet 273 holding the member 271 to be transferred can be transferred.

Figure 28:
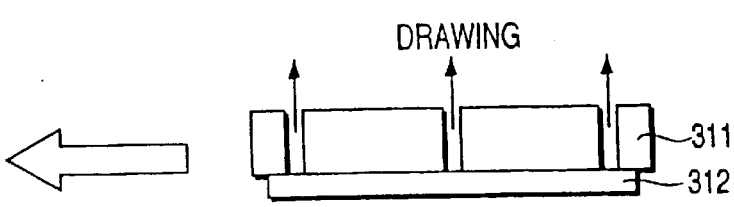
FIG. 28 shows a conventional transfer method of substrate or chip.

In this case, the magnetic field generated between the magnetic body 272 and the electromagnet 273 is evenly distributed, so that substantially no part of the member 271 to be transferred is partially subjected to a large force. Therefore, according to the present embodiment, there is no chance of having the member 271 to be transferred deformed or damaged, even if the member 271 to be transferred is of a thin material, unlike the case where the vacuum suction method is employed, as shown in FIG. 28.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method, comprising:

applying a paste containing a magnetic body onto a surface of a first substrate having a groove corresponding to either a bump or a wiring to fill the groove with the paste;

removing the paste remaining outside the groove;

applying either a hardening or baking treatment to the paste and forming a connection member for either the bump or the wiring; and transferring said connection member, embedded in the groove, onto a second substrate other than the first substrate, wherein, during filling with the paste, a magnetic field is generated for drawing the paste into the groove either when applying the paste or after applying the paste.

2. A semiconductor device manufacturing method according to claim 1, wherein the magnetic field is formed in a central portion of an opening of said groove during removing the connection member from the first substrate.

3. A semiconductor device manufacturing method according to claim 1, wherein, during removing the connection member from the first substrate, viscosity of the paste, constituting the connection member embedded in the groove, is reduced by using at least one of heat and ultrasonic waves.

4. A semiconductor device manufacturing method according to claim 1, wherein, subsequent to removing the connection member from the first substrate, the magnetic body in the connection member is demagnetized.

5. A semiconductor device manufacturing method according to claim 1, wherein, subsequent to removing the connection member from the first substrate, a magnetic property of the magnetic body in the paste is extinguished.

6. A semiconductor device manufacturing method, comprising:

applying an insulating paste containing a magnetic body onto a first substrate having a groove corresponding to an insulating film onto a surface of the first substrate to fill the groove with the paste;

removing the paste remaining outside the groove;

forming an insulating film by applying either a hardening or a baking treatment to the insulating paste; and transferring the insulating film embedded in the groove onto a second substrate other than the first substrate by removing the insulating film from the first substrate, wherein, during filling the groove with the insulating paste, a magnetic field for drawing the insulating paste into the groove either when applying the insulating paste or after applying the insulating paste.

7. A pattern forming method comprising:

applying a paste containing a magnetic body onto a surface of a first substrate having a plurality of grooves on the surface thereof to fill the plurality of grooves with the paste;

removing the paste remaining outside the plurality of grooves;

disposing the first substrate, with the plurality of grooves facing downward, over a second substrate; and transferring the paste in the plurality of grooves onto the second substrate by an effect of scanning by a magnet disposed under the second substrate.

8. A pattern forming method comprising:

applying a paste onto a first substrate having a plurality of grooves provided thereon to fill the plurality of grooves with the paste;

removing the paste remaining outside the plurality of grooves;

electrifying the paste in the plurality of the grooves;

disposing the first substrate, with the plurality of the grooves facing downward, above a second substrate; and generating an electric field between the first substrate and the second substrate by controlling the potential of the second substrate, whereby the paste in the plurality of the grooves electrified by the electric field is transferred onto the second substrate.

\* \* \* \* \*